US009314846B2

(12) United States Patent
Miyashita et al.

(10) Patent No.: US 9,314,846 B2
(45) Date of Patent: *Apr. 19, 2016

(54) PROCESS FOR PRODUCING FEPT-BASED SPUTTERING TARGET

(71) Applicant: TANAKA KIKINZOKU KOGYO K.K., Tokyo (JP)

(72) Inventors: Takanobu Miyashita, Tsukuba (JP); Yasuyuki Goto, Tsukuba (JP); Takamichi Yamamoto, Tsukuba (JP); Ryousuke Kushibiki, Tsukuba (JP); Masahiro Aono, Tsukuba (JP); Masahiro Nishiura, Tsukuba (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 38 days.

This patent is subject to a terminal disclaimer.

(21) Appl. No.: 14/330,786

(22) Filed: Jul. 14, 2014

(65) Prior Publication Data

US 2014/0322063 A1 Oct. 30, 2014

Related U.S. Application Data

(63) Continuation of application No. PCT/JP2013/050430, filed on Jan. 11, 2013.

(30) Foreign Application Priority Data

Jan. 13, 2012 (JP) ................................ 2012-005695

(51) Int. Cl.
*B22F 3/12* (2006.01)
*B22F 9/08* (2006.01)
(Continued)

(52) U.S. Cl.
CPC ... *B22F 3/12* (2013.01); *B22F 9/04* (2013.01); *B22F 9/08* (2013.01); *C22C 1/0466* (2013.01);
(Continued)

(58) Field of Classification Search
CPC .... B22F 2999/00; B22F 2201/03; B22F 3/12; C23C 14/34
USPC ........................................................... 419/51
See application file for complete search history.

(56) References Cited

U.S. PATENT DOCUMENTS

| 5,736,013 A | 4/1998 | Ranjan et al. |
| 5,989,728 A | 11/1999 | Coffey et al. |

(Continued)

FOREIGN PATENT DOCUMENTS

| CN | 1962951 A | 5/2007 |
| CN | 102168268 A | 8/2011 |

(Continued)

OTHER PUBLICATIONS

Chen et al., "Granular $L1_0$ FePt-X (X=C, $TiO_2$, $Ta_2O_5$) (001) nanocomposite films with small grain size for high density magnetic recording," Journal of Applied Physics, 2009, pp. 07B702-1-07B702-3, vol. 105.

(Continued)

*Primary Examiner* — Weiping Zhu
(74) *Attorney, Agent, or Firm* — Oliff PLC

(57) ABSTRACT

A process for producing an FePt-based sputtering target includes adding metal oxide powder containing unavoidable impurities to FePt-based alloy powder containing Pt in an amount of 40 at % or more and less than 60 at % and one or more kinds of metal elements other than Fe and Pt in an amount of more than 0 at % and 20 at % or less with the balance being Fe and unavoidable impurities and with a total amount of Pt and the one or more kinds of metal elements being 60 at % or less so that the metal oxide powder accounts for 20 vol % or more and 40 vol % or less of a total amount of the FePt-based alloy powder and the metal oxide powder, followed by mixing the FePt-based alloy powder and the metal oxide powder to produce a powder mixture.

26 Claims, 15 Drawing Sheets

(51) Int. Cl.

| | | |
|---|---|---|
| *C23C 14/34* | (2006.01) | |
| *C22C 1/05* | (2006.01) | |
| *C22C 5/04* | (2006.01) | |
| *C22C 32/00* | (2006.01) | |
| *G11B 5/851* | (2006.01) | |
| *B22F 9/04* | (2006.01) | |
| *C22C 1/04* | (2006.01) | |
| *C22C 1/10* | (2006.01) | |
| *H01J 37/34* | (2006.01) | |
| *C23C 14/06* | (2006.01) | |
| *C22C 38/00* | (2006.01) | |
| *C22C 38/16* | (2006.01) | |

(52) U.S. Cl.
CPC ... *C22C 1/05* (2013.01); *C22C 1/10* (2013.01); *C22C 5/04* (2013.01); *C22C 32/00* (2013.01); *C23C 14/0635* (2013.01); *C23C 14/34* (2013.01); *C23C 14/3414* (2013.01); *G11B 5/851* (2013.01); *H01J 37/3429* (2013.01); *B22F 9/082* (2013.01); *B22F 2201/03* (2013.01); *B22F 2999/00* (2013.01); *C22C 38/002* (2013.01); *C22C 38/16* (2013.01); *H01J 37/3491* (2013.01); *H01J 2237/3322* (2013.01); *H01J 2237/3323* (2013.01)

(56) References Cited

U.S. PATENT DOCUMENTS

| | | | |
|---|---|---|---|
| 6,599,646 | B2 | 7/2003 | Suzuki et al. |
| 6,666,930 | B2 | 12/2003 | Aoyama et al. |
| 7,909,949 | B2 | 3/2011 | Nakamura et al. |
| 8,173,282 | B1 | 5/2012 | Sun et al. |
| 8,858,674 | B2 | 10/2014 | Miyashita et al. |
| 2006/0021871 | A1 | 2/2006 | Kuo et al. |
| 2006/0051622 | A1 | 3/2006 | Shin et al. |
| 2006/0110626 | A1 | 5/2006 | Ziani et al. |
| 2007/0189916 | A1 | 8/2007 | Zhang |
| 2008/0210555 | A1 | 9/2008 | Yang et al. |
| 2009/0053089 | A1 | 2/2009 | Yang et al. |
| 2009/0242393 | A1 | 10/2009 | Satoh |
| 2013/0168240 | A1* | 7/2013 | Ogino .......... C23C 14/3414 204/298.13 |
| 2013/0213803 | A1 | 8/2013 | Sato et al. |
| 2013/0306471 | A1 | 11/2013 | Ishiyama et al. |

FOREIGN PATENT DOCUMENTS

| | | | | |
|---|---|---|---|---|
| JP | H05-311413 | A | 11/1993 | |
| JP | H06-081010 | A | 3/1994 | |
| JP | H06-081011 | A | 3/1994 | |
| JP | H08-157904 | A | 6/1996 | |
| JP | H10-338573 | A | 12/1998 | |
| JP | A-2003-313659 | | 11/2003 | |
| JP | A-2006-161082 | | 6/2006 | |
| JP | 2006-517612 | A | 7/2006 | |
| JP | B2-3950838 | | 8/2007 | |
| JP | 2008-127591 | A | 6/2008 | |
| JP | 2008-169464 | A | 7/2008 | |
| JP | 2008-179900 | A | 8/2008 | |
| JP | 2008-189996 | A | 8/2008 | |
| JP | A-2011-208167 | | 10/2011 | |
| JP | WO 2012029498 | A1 * | 3/2012 | .......... C23C 14/3414 |
| JP | 2012-102387 | A | 5/2012 | |
| JP | 2012-178210 | A | 9/2012 | |
| JP | 2012-178211 | A | 9/2012 | |
| TW | 200604361 | | 2/2006 | |
| TW | 200728483 | A | 8/2007 | |
| TW | I393794 | B | 8/2007 | |
| TW | 200837209 | A | 9/2008 | |
| TW | 201229274 | A | 7/2012 | |
| TW | I393794 | B | 4/2013 | |
| WO | WO 2012/029498 | | 3/2012 | |
| WO | 2012/086300 | A1 | 6/2012 | |
| WO | WO 2012/086335 | | 6/2012 | |
| WO | 2013/094605 | A1 | 6/2013 | |

OTHER PUBLICATIONS

Apr. 23, 2013 International Search Report issued in International Patent Application No. PCT/JP2013/050430.
Mi et al., "Characterization of Cu additive FePt—C granular films," Applied Surface Science, 2006, pp. 8688-8694, vol. 252.
Jul. 22, 2015 Office Action issued in U.S. Appl. No. 14/330,775.
Nov. 30, 2015 Office Action issued in U.S. Appl. No. 14/330,775.
Dunkley, "Atomization," ASM Handbook vol. 7 (1998), pp. 35-52.
Jul. 9, 2015 Office Action issued in U.S. Appl. No. 14/328,106.
Hu, et al., "Exchange coupling assisted FePtC perpendicular recording media," Applied Physics Letters, 2008, vol. 93, 072504, American Institute of Physics.
Jiang, et al., "Magnetic Properties of Isolated FePt—C Nanocomposited Films," IEEE Transactions on Magnetics, Jun. 2010, vol. 46, No. 6, pp. 1914-1917, IEEE.
Chen, et al., "Low temperature deposited L10 FePt—C films with high coercivity and small grain size," Applied Physics Letters, 2007, vol. 91, 132506, American Institute of Physics.
Jun. 12, 2012 International Search Report issued in International Application No. PCT/JP2012/056726.
Jun. 12, 2012 Written Opinion of the International Searching Authority issued in International Application No. PCT/JP2012/056726.
Apr. 28, 2014 Information offer form for JP Application No. 2012-005696.
Aug. 24, 2015 Information offer form for JP Application No. 2013-514450.
Aug. 24, 2015 Information offer form for JP Application No. 2013-514451.
Apr. 23, 2013 International Search Report issued in International Application No. PCT/JP2013/050429.

\* cited by examiner

PROCESS FOR PRODUCING FEPT-BASED SPUTTERING TARGET

This is a Continuation of Application No. PCT/W2013/050430 filed Jan. 11, 2013, which claims the benefit of Japanese Application No. 2012-005695 filed Jan. 13, 2012. The disclosure of the prior application is hereby incorporated by reference herein in its entirety.

TECHNICAL FIELD

The present invention relates to an FePt-based sputtering target and to a process for producing the same.

BACKGROUND ART

An FePt alloy can be provided with the fct (Ordered Face Centered Tetragonal) structure which has high crystal magnetic anisotropy by heat-treating at an elevated temperature (for example, at 600° C. or higher), and therefore an FePt alloy has been highlighted as a magnetic recording medium. To make FePt particles smaller and more uniform in the thin film of the FePt alloy, it is proposed that a predetermined quantity of carbon (C) be included into the thin film of the FePt alloy (for example, Patent Literature 1).

However, the formation method of the FePtC thin film, described in the Patent Literature 1, is the method of vapor-depositing Fe, Pt, and C simultaneously on an MgO (100) substrate by using the Fe target of a 2-inch diameter, C target of a 2-inch diameter, and the Pt target of 5 mm in height and width. In this method, it is difficult to obtain the film whose composition is controlled strictly. Additionally, three targets are required and each target needs a cathode, a power supply, etc., and so the cost of equipment becomes high while the preparatory work of sputtering takes time and effort.

It is thought that an FePtC thin film found by the process for forming an FePtC thin film described in Patent Literature 1 has a granular structure in which FePt alloy particles are separated by partitions of C, thereby allowing the FePtC thin film to exhibit magnetic recording characteristics. However, when the partitions of the granular structure were formed only of C (carbon), a carbon phase 14 grew to surround FePt alloy particles 12 growing on a substrate surface 10A of a substrate 10, for example, as illustrated in FIG. 1. This sometimes prevented the FePt alloy particles 12 from growing vertically onto the substrate surface 10A so that a plurality of the FePt alloy particles 12 were deposited vertically onto the substrate surface 10A (for example, Non-Patent Literature 1). When a plurality of the FePt alloy particles 12 are deposited vertically onto the substrate surface 10A, the obtained thin film may have deteriorated characteristics as a magnetic recording medium, or may be useless as a magnetic recording medium.

In order to suppress the phenomenon that a plurality of the FePt alloy particles 12 are deposited vertically onto the substrate surface 10A, metal oxides such as $Ta_2O_5$ and $TiO_2$ may be effectively used instead of C to form the partitions of the granular structure, which is disclosed in Non-Patent Literature 1.

CITATION LIST

Patent Literature

Patent Literature 1: Japanese Patent No. 3950838

Non-Patent Literature

Non-Patent Literature 1: J. S. Chen et al., Granular $L1_0$ FePt—X (X=C, $TiO_2$, $Ta_2O_5$) (001) nanocomposite films with small grain size for high density magnetic recording, Journal of Applied Physics, American Institute of Physics, 2009, Volume: 105, Pages: 07B702-1 to 07B702-3.

SUMMARY OF INVENTION

Technical Problem

However, to form the partitions of the granular structure with a metal oxide instead of C, the process for forming an FePtC thin film described in Patent Literature 1 requires installation of a metal oxide target, instead of a C target, into a sputtering device. This process takes time and effort for preparation of sputtering and also increases the cost of the device.

The present inventors have believed that C and a metal oxide are effectively used to form the partitions of the granular structure. To form the partitions of the granular structure not with only C but with C and a metal oxide, the process for forming an FePtC thin film described in Patent Literature 1 not only requires installation of three targets, Fe, Pt, and C into a sputtering device, but also requires installation of a metal oxide target into a sputtering device. This process takes more time and effort for preparation of sputtering and also increases the cost of the device.

The present inventors have studied about inclusion of a third metal element in FePt-alloy particles to improve the performance of a FePt-based thin film as a magnetic recording medium and to improve the ease of production. In order to include the third metal element in the FePt-alloy particles, the process for forming an FePtC thin film described in Patent Literature 1 further requires installation of a target of the third metal element into a sputtering device. This process takes more time and effort for preparation of sputtering and also increases the cost of the device.

The present invention has been made in view of the aforementioned problems. It is an object of the present invention to provide an FePt-based sputtering target which alone can form a thin film containing an FePt-based alloy and being usable as a magnetic recording medium without using a plurality of targets, and a process for producing the same.

Solution to Problem

As a result of intensive research to solve the aforementioned problem, the present inventors found out that the aforementioned problem is solvable with the following FePt-based sputtering targets and solvable with the following processes for producing the FePt-based sputtering target, and the present inventors created the present invention.

Namely, a first aspect of an FePt-based sputtering target according to the present invention is an FePt-based sputtering target containing Fe, Pt, a metal oxide, and further containing one or more kinds of metal elements other than Fe and Pt, wherein the FePt-based sputtering target has a structure in which an FePt-based alloy phase and a metal oxide phase containing unavoidable impurities are mutually dispersed, the FePt-based alloy phase containing Pt in an amount of 40 at % or more and less than 60 at % and the one or more kinds of metal elements other than Fe and Pt in an amount of more than 0 at % and 20 at % or less with the balance being Fe and unavoidable impurities and with a total amount of Pt and the one or more kinds of metal elements being 60 at % or less, and wherein the metal oxide is contained in an amount of 20 vol % or more and 40 vol % or less based on a total amount of the target._

The phrase "an FePt-based alloy phase and a metal oxide phase containing unavoidable impurities are mutually dispersed" is a concept including a state in which the FePt-based alloy phase is a dispersion medium and the metal oxide phase is a dispersoid and a state in which the metal oxide phase is a dispersion medium and the FePt-based alloy phase is a dispersoid and further including a state in which the FePt-based alloy phase and the metal oxide phase are mixed with each other but it is not possible to determine which phase is a dispersion medium and which phase is a dispersoid.

In the present description, the FePt-based alloy means an alloy containing Fe and Pt as main components and includes not only a binary alloy containing only Fe and Pt but also ternary and higher alloys containing Fe and Pt as main components and an additional metal element(s) other than Fe and Pt. As used herein, the FePt-based sputtering target means a sputtering target containing Fe and Pt as main components and also includes sputtering targets containing, in addition to Fe and Pt, other metal component(s), an oxide, C, and the like.

In the present description, the phrase "$\alpha$ or more and $\beta$ or less" may be described as "from $\alpha$ to $\beta$."

A second aspect of an FePt-based sputtering target according to the present invention is an FePt-based sputtering target containing Fe, Pt, C, a metal oxide, and further containing one or more kinds of metal elements other than Fe and Pt, wherein the FePt-based sputtering target has a structure in which an FePt-based alloy phase, a C phase containing unavoidable impurities, and a metal oxide phase containing unavoidable impurities are mutually dispersed, the FePt-based alloy phase containing Pt in an amount of 40 at % or more and less than 60 at % and the one or more kinds of metal elements other than Fe and Pt in an amount of more than 0 at % and 20 at % or less with the balance being Fe and unavoidable impurities and with a total amount of Pt and the one or more kinds of metal elements being 60 at % or less, and wherein C is contained in an amount of more than 0 vol % and 20 vol % or less based on a total amount of the target, the metal oxide is contained in an amount of 10 vol % or more and less than 40 vol % based on the total amount of the target, and a total content of C and the metal oxide is 20 vol % or more and 40 vol % or less based on the total amount of the target.

The phrase "an FePt-based alloy phase, a C phase containing unavoidable impurities, and a metal oxide phase containing unavoidable impurities are mutually dispersed" means a state in which any of the FePt-based alloy phase, the C phase, and the metal oxide phase can be a dispersoid(s) and any of the phases can be a dispersion medium/media, i.e., in any case, the FePt-based alloy phase, the C phase, and the metal oxide phase are mutually mixed, and moreover the above phrase is a concept including a state in which the FePt-based alloy phase, the C phase, and the metal oxide phase are mixed with each other but it is not possible to determine which phase is a dispersion medium and which phase is a dispersoid.

In the first aspect, the metal oxide phase preferably has an average size of 0.4 μm or less as determined by an intercept method.

In the second aspect, the phase consisting of the C phase and the metal oxide phase preferably has an average size of 0.4 μm or less as determined by an intercept method.

A process for determining the average size of the metal oxide phase by the intercept method, and a process for determining the average size of the phase consisting of the C phase and the metal oxide phase will be described below in the section of "DESCRIPTION OF EMBODIMENTS."

In the first and second aspects, the one or more kinds of metal elements other than Fe and Pt may be one or more kinds of Cu, Ag, Mn, Ni, Co, Pd, Cr, V, and B. The one or more metal elements other than Fe and Pt may include Cu, or the one or more metal elements other than Fe and Pt may be only Cu.

In the first and second aspects, the metal oxide may contain, for example, at least one of $SiO_2$, $TiO_2$, $Ti_2O_3$, $Ta_2O_5$, $Cr_2O_3$, CoO, $Co_3O_4$, $B_2O_3$, $Fe_2O_3$, CuO, $Cu_2O$, $Y_2O_3$, MgO, $Al_2O_3$, $ZrO_2$, $Nb_2O_5$, $MoO_3$, $CeO_2$, $Sm_2O_3$, $Gd_2O_3$, $WO_2$, $WO_3$, $HfO_2$, and $NiO_2$.

Preferably, the FePt-based sputtering target has a relative density of 90% or higher.

Some of the above-described FePt-based sputtering targets can be preferably used for a magnetic recording medium.

A first aspect of a process for producing an FePt-based sputtering target according to the present invention is a process for producing an FePt-based sputtering target, including: adding metal oxide powder containing unavoidable impurities to FePt-based alloy powder containing Pt in an amount of 40 at % or more and less than 60 at % and one or more kinds of metal elements other than Fe and Pt in an amount of more than 0 at % and 20 at % or less with the balance being Fe and unavoidable impurities and with a total amount of Pt and the one or more kinds of metal elements being 60 at % or less so that the metal oxide powder accounts for 20 vol % or more and 40 vol % or less of a total amount of the FePt-based alloy powder and the metal oxide powder, followed by mixing the FePt-based alloy powder and the metal oxide powder to produce a powder mixture; and molding the produced powder mixture while the powder mixture is heated under pressure.

A second aspect of a process for producing an FePt-based sputtering target according to the present invention is a process for producing an FePt-based sputtering target, including: adding C powder containing unavoidable impurities and metal oxide powder containing unavoidable impurities to FePt-based alloy powder containing Pt in an amount of 40 at % or more and less than 60 at % and one or more kinds of metal elements other than Fe and Pt in an amount of more than 0 at % and 20 at % or less with the balance being Fe and unavoidable impurities and with a total amount of Pt and the one or more kinds of metal elements being 60 at % or less so that the C powder and the metal oxide powder are added to satisfy:

$$0 < \alpha \leq 20;$$

$$10 \leq \beta < 40; \text{ and}$$

$$20 \leq \alpha + \beta \leq 40,$$

where $\alpha$ and $\beta$ represent contents of the C powder and the metal oxide powder by vol %, respectively, based on a total amount of the FePt-based alloy powder, the C powder, and the metal oxide powder, followed by mixing the FePt-based alloy powder, the C powder, and the metal oxide powder to produce a powder mixture; and molding the produced powder mixture while the powder mixture is heated under pressure.

In a first aspect of the production process, the metal oxide phase in the obtained FePt-based sputtering target has an average size of 0.4 μm or less as determined by the intercept method.

In a second aspect of the production process, the phase consisting of the C phase and the metal oxide phase in the obtained FePt-based sputtering target has an average size of 0.4 μm or less as determined by the intercept method.

In the first and second aspects of the production process, the one or more kinds of metal elements other than Fe and Pt may be one or more kinds of Cu, Ag, Mn, Ni, Co, Pd, Cr, V, and B. The one or more metal elements other than Fe and Pt may include Cu, or the one or more metal elements other than Fe and Pt may be only Cu.

In the first and second aspects of the production process, the metal oxide may contain, for example, at least one of $SiO_2$, $TiO_2$, $Ti_2O_3$, $Ta_2O_5$, $Cr_2O_3$, $CoO$, $Co_3O_4$, $B_2O_3$, $Fe_2O_3$, $CuO$, $Cu_2O$, $Y_2O_3$, $MgO$, $Al_2O_3$, $ZrO_2$, $Nb_2O_5$, $MoO_3$, $CeO_2$, $Sm_2O_3$, $Gd_2O_3$, $WO_2$, $WO_3$, $HfO_2$, and $NiO_2$.

Some of the obtained FePt-based sputtering targets can be preferably used for a magnetic recording medium.

A third aspect of the FePt-based sputtering target according to the present invention is an FePt-based sputtering target produced by any one of the above production processes.

Advantageous Effects of Invention

The use of the FePt-based sputtering target according to the present invention allows formation of a thin film containing an FePt-based alloy and being usable as a magnetic recording medium with the single target alone, i.e., without using a plurality of targets.

Moreover, the FePt-based sputtering target according to the present invention contains a predetermined amount of the metal oxide, so that a thin film obtained by sputtering and containing the FePt-based alloy is likely to have a favorable granular structure.

DESCRIPTION OF EMBODIMENTS

Figure 1:
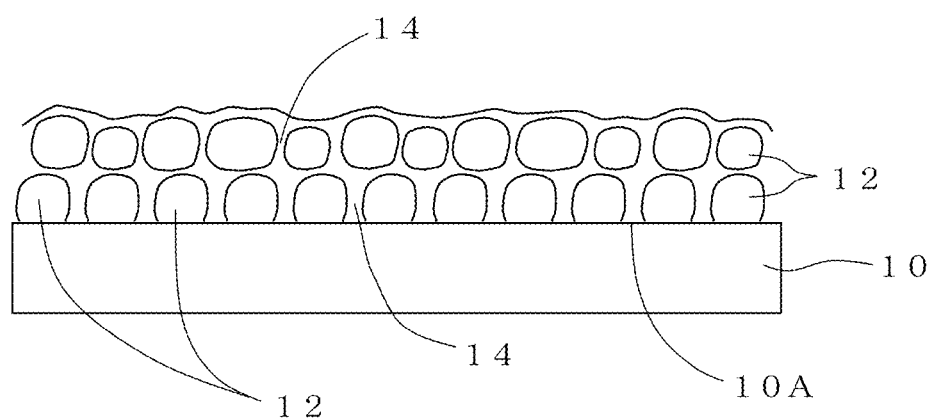
FIG. 1 is an example of a problematic magnetic recording medium having a granular structure with partitions formed only of C (carbon).

Embodiments of the present invention will next be described in detail.

1. First Embodiment 1-1. Components and Structure of Sputtering Target

An FePt-based sputtering target according to a first embodiment of the present invention contains Fe, Pt, and a metal oxide and further contains Cu, which is a metal element other than Fe and Pt. The FePt—C-based sputtering target is characterized in that it has a structure in which an FePt-based alloy phase and a metal oxide phase containing unavoidable impurities are mutually dispersed, the FePt-based alloy phase containing Pt in an amount of 40 at % or more and less than 60 at % and Cu in an amount of more than 0 at % and 20 at % or less with the balance being Fe and unavoidable impurities and with the total amount of Pt and Cu being 60 at % or less, and that the content of the metal oxide is 20 vol % or more and 40 vol % or less based on the total amount of the target.

1-1-1. FePtCu Alloy

The FePt alloy can have an fct structure with high magnetocrystalline anisotropy when subjected to heat treatment at high temperature (e.g., 600° C. or higher). Therefore, the FePt alloy has a role in serving as a recording layer of a magnetic recording medium and is a main component of the FePt-based sputtering target according to the first embodiment of the present invention. In the FePt-based sputtering target according to the first embodiment, Cu is contained in an FePt alloy to form an FePtCu alloy.

When Cu is contained, the temperature of the heat treatment for converting the crystal structure of the FePt-based alloy to the fct structure can be reduced (to, for example, 600° C.), so that the cost of the heat treatment on an FePtCu-metal oxide layer obtained by sputtering can be reduced. In addition, the addition of Cu may allow the crystal structure of the obtained FePtCu-metal oxide layer to be converted to the fct structure by heat generated during sputtering without additional heat treatment.

A metal other than Cu can be added to the FePt alloy, and examples thereof include Ag, Mn, Ni, Co, Pd, Cr, V, and B.

In the first embodiment, the reason that the content of Pt in the FePtCu alloy phase is defined to be 40 at % or more and less than 60 at % in this embodiment is that, when the content of Pt in the FePtCu alloy phase is outside the range of 40 at % or more and less than 60 at %, the fct (ordered face centered tetragonal) structure may not appear. The content of Pt in the FePtCu alloy phase is preferably 45 at % or more and 55 at % or less, more preferably 49 at % or more and 51 at % or less, and particularly preferably 50 at %, from the viewpoint that the fct (ordered face centered tetragonal) structure appears reliably in the FePtCu alloy phase.

The reason that the content of Cu in the FePtCu alloy phase is defined to more than 0 at % and 20 at % or less is that the above-mentioned effect of decreasing the temperature of the heat treatment (to, for example, 600° C.) may not be obtained unless the FePtCu alloy phase contains Cu, and that the proportion of Fe or Pt in the FePtCu alloy phase decreases if the FePtCu alloy phase contains more than 20 at % of Cu, so that the fct (ordered face centered tetragonal) structure may not appear.

The reason that the total amount of Pt and Cu in the FePtCu alloy phase is defined to 60 at % or less is that the proportion of Fe in the FePtCu alloy phase decreases if the total amount of Pt and Cu is more than 60 at %, so that the fct (ordered face centered tetragonal) structure may not appear.

1-1-2. Metal Oxide

The metal oxide can form the partitions for separating the FePtCu alloy particles, which are magnetic particles, from each other in a layer containing the FePtCu alloy and the metal oxide (hereinafter, may be referred to as an FePtCu-metal oxide layer) obtained by sputtering, and has a role in reducing and uniformizing the size of the FePtCu alloy particles in the FePtCu-metal oxide layer. The metal oxide is a main component in the FePtCu-based sputtering target according to the first embodiment.

When only C is used instead of the metal oxide, C grows to surround the FePt-alloy particles during sputtering, as described above using FIG. 1. This may prevent the FePt-alloy particles from growing vertically onto the substrate surface, so that the FePt-alloy particles may be deposited vertically onto the substrate surface to deteriorate the characteristics as a magnetic recording medium. However, this can be avoided by using the metal oxide to obtain a favorable magnetic recording medium.

In the first embodiment, the reason that the content of the metal oxide is defined to 20 vol % or more and 40 vol % or less based on the total amount of the target is that the metal oxide serves as partitions for separating the FePtCu-alloy particles, which are magnetic particles, from each other in the FePtCu-metal oxide layer obtained by sputtering to achieve the effect of reducing and uniformizing the size of the FePtCu alloy particles. If the content of the metal oxide is less than 20 vol %, this effect may not be sufficiently achieved. If the content of the metal oxide exceeds 40 vol %, the number of the FePtCu alloy particles per unit volume of the FePtCu-metal oxide layer obtained by sputtering decreases, and this is disadvantageous for storage capacity. The content of the metal oxide is preferably from 25 to 35 vol % based on the total amount of the target, more preferably from 28 to 32 vol %, from the viewpoint of achieving the effect of reducing and uniformizing the size of the FePtCu particles in the FePtCu-metal oxide layer and from the viewpoint of the storage capacity of the FePtCu-metal oxide layer to be formed.

In the first embodiment, the metal oxide may contain, for example, at least one of $SiO_2$, $TiO_2$, $Ti_2O_3$, $Ta_2O_5$, $Cr_2O_3$, $CoO$, $Co_3O_4$, $B_2O_3$, $Fe_2O_3$, $CuO$, $Cu_2O$, $Y_2O_3$, $MgO$, $Al_2O_3$, $ZrO_2$, $Nb_2O_5$, $MoO_3$, $CeO_2$, $Sm_2O_3$, $Gd_2O_3$, $WO_2$, $WO_3$, $HfO_2$, and $NiO_2$.

1-1-3. Structure of Target

The FePt-based sputtering target according to the first embodiment has a structure in which an FePtCu alloy phase and a metal oxide phase containing unavoidable impurities are mutually dispersed, the FePtCu alloy phase containing Pt in an amount of 40 at % or more and less than 60 at % and Cu in an amount of more than 0 at % and 20 at % or less with the balance being Fe and unavoidable impurities and with the total amount of Pt and Cu being 60 at % or less, wherein the content of the metal oxide is 20 vol % or more and 40 vol % or less based on the total amount of the target.

The reason for having the structure in which the FePtCu alloy phase and the metal oxide phase are mutually dispersed is to prevent certain regions from being sputtered at an excessive high rate during sputtering to improve the sputtering.

It is preferable to reduce the size of the metal oxide phase in the target as much as possible, in order to reduce the difference in sputtering rate at different positions. Therefore, the average size of the metal oxide phase in the target is preferably 0.4 µm or less as determined by the intercept method, more preferably 0.35 µm or less, and particularly preferably 0.3 µm or less.

In order to reduce the average size of the metal oxide phase in the target, the current size reduction technique requires extension of the time for mixing FePtCu alloy powder and metal oxide powder. Therefore, it is unpractical to significantly reduce the average size of the metal oxide phase in the target with the current size reduction technique in terms of production efficiency. When the average size of the metal oxide phase in the target is smaller to a certain extent, the problem associated with the difference in sputtering rate at different positions does not particularly occur. Therefore, the lower limit may be set on the average size of the metal oxide phase in the target. When the lower limit is set, in consideration of the cost of the current size reduction technique, the average size of the metal oxide phase in the target, as determined by the intercept method, is preferably from 0.1 to 0.4 µm, more preferably from 0.15 to 0.35 µm, and particularly preferably from 0.2 to 0.3 µm.

In the present description, the average size of the metal oxide phase is determined by the intercept method in the following manner.

First, two horizontal lines are drawn in a left-right direction on a SEM photograph of the cross section of the target taken at a magnification of 10,000× so that the image is divided vertically into three parts, and three vertical lines are drawn in a vertical direction so that the image is divided horizontally into four parts. As a result, a total of five lines are drawn on the SEM photograph of the cross section of the target taken at a magnification of 10,000×.

For each of the five lines, the total length of line segments intersecting the metal oxide phase and the number of the metal oxide phase intersected by the line are determined. Then the average of the lengths of the segments of the five lines that intersect the metal oxide phase is determined (by dividing the total length of the line segments intersecting the metal oxide phase by the number of the metal oxide phases intersected by the lines), and the obtained value is used as the average size of the metal oxide phase determined by the intercept method.

In order to perform sputtering favorably, it is preferable that the relative density of the target be large because the larger the value of the relative density, the smaller the volume of voids in the target. More specifically, the relative density of the target is preferably 90% or higher. To increase the relative density of the target, it is preferable to mix the FePtCu alloy powder and the metal oxide powder sufficiently to reduce the particle size of the metal oxide powder, as described later. The size of the metal oxide phase in the target is thereby reduced, and the voids in the target can be filled by the plastic flow of the FePtCu alloy during sintering, so that the relative density increases.

The content of nitrogen is preferably 30 ppm by mass or less based on the total amount of the target. As the content of nitrogen in the target decreases, the content of nitrogen in the FePtCu-metal oxide layer to be obtained by sputtering also decreases, so that the FePtCu-metal oxide layer obtained is favorable.

1-2. Production Process

The FePt-based sputtering target according to the first embodiment can be produced by: adding metal oxide powder containing unavoidable impurities to FePtCu alloy powder containing Pt in an amount of 40 at % or more and less than 60 at % and Cu in an amount of more than 0 at % and 20 at % or less with the balance being Fe and unavoidable impurities and with the total amount of Pt and Cu being 60 at % or less, followed by mixing the FePtCu alloy powder and the metal oxide powder to produce a powder mixture; and molding the produced powder mixture while the powder mixture is heated under pressure.

In this production process, Fe, Pt and Cu are supplied as the FePtCu alloy powder, and are not supplied as a single powder of Fe, a single powder of Pt, and a single powder of Cu. A single powder of Fe has high activity and may ignite in the air. However, when Fe is alloyed with Pt and Cu to form an FePtCu alloy powder, the activity of Fe can be reduced even in the form of powder. For this reason, this production process can suppress oxidation and ignition of Fe during mixing with the metal oxide powder, and/or oxidation and ignition of Fe when a mixing container is open to the air after mixing.

When the atmosphere contains oxygen during the production of the powder mixture, it can prevent the metal oxide powder from being reduced during mixing and thus can prevent incorporation of metal originated from the metal oxide powder into the FePtCu alloy powder during mixing. Therefore, an FePt-based thin film produced by using the obtained FePt-based sputtering target is likely to exhibit stable magnetic recording characteristics.

1-2-1. Production of FePtCu Alloy Powder

No particular limitation is imposed on the process for producing the FePtCu alloy powder. However, in the first embodiment, an atomizing method is performed using a molten FePtCu alloy containing Pt in an amount of 40 at % or more and less than 60 at % and Cu in an amount of more than 0 at % and 20 at % or less with the balance being Fe and unavoidable impurities and with the total amount of Pt and Cu being 60 at % or less to produce FePtCu alloy powder having the same composition as the molten FePtCu alloy.

When the FePtCu alloy powder has the above composition, the FePtCu alloy phase in the target obtained by sintering of the FePtCu alloy powder has the above composition, so that the fct structure is likely to appear in an FePtCu phase in an FePtCu-metal oxide layer obtained by sputtering using the above target.

Preferably, the FePtCu alloy powder is produced by an atomizing method. This is because of the following reason. In an atomizing method, raw metals (Fe and Pt) are first heated to high temperature to form molten metals. In this stage, alkali metals such as Na and K, alkaline-earth metals such as Ca, and gaseous impurities such as oxygen and nitrogen are volatilized and removed to the outside, so that the amount of impurities in the FePtCu alloy powder can be reduced. When a gas atomizing method is used, the amount of impurities in the FePtCu alloy powder can be further reduced by performing atomizing using argon gas or nitrogen gas.

The target obtained using the FePtCu alloy powder obtained by an atomizing method contains a reduced amount of impurities, so that the content of nitrogen can be suppressed to 30 mass ppm or less.

Therefore, sputtering performed using the target is favorable, and an FePtCu-metal oxide layer to be obtained is also favorable.

Examples of an applicable atomizing method include, for example, a gas atomizing method and a centrifugal atomizing method.

1-2-2. Mixing

The powder mixture is produced by mixing metal oxide powder having an average particle diameter of, for example, from 20 to 100 nm with the FePtCu alloy powder obtained by the atomizing method described above so that the content of the metal oxide powder is 20 vol % or more and 40 vol % or less based on the total amount of the powder mixture.

When the atmosphere contains oxygen during the production of the powder mixture, it can prevent the metal oxide powder from being reduced during mixing and thus can prevent incorporation of metal originated from the metal oxide powder into the FePtCu alloy powder during mixing. An FePt-based thin film produced by using the obtained FePt-based sputtering target is likely to exhibit stable magnetic recording characteristics.

From the viewpoint of preventing the metal oxide powder from being reduced during mixing, it is preferable that oxygen be continuously supplied from the outside of the mixing container to the atmosphere during mixing. Continuous supply of oxygen hardly causes a shortage of oxygen in the atmosphere and easily prevents the metal oxide powder from being reduced during mixing.

However, if the amount of oxygen in the atmosphere during mixing of the FePtCu alloy powder and the metal oxide powder is too large, the powder mixture may contain an excess amount of oxygen during mixing.

From the viewpoint of preventing the metal oxide powder from being reduced during mixing, and from the viewpoint that the powder mixture may contain an excess amount of oxygen during mixing if the amount of oxygen in the atmosphere is too large, the concentration of oxygen in the atmosphere during mixing is preferably from 10 to 30 vol %, more preferably from 15 to 25 vol %, particularly preferably from 19 to 22 vol %.

Oxygen may be supplied to the atmosphere during mixing by supplying air. This can reduce cost.

The atmosphere during mixing may be composed substantially of an inert gas and oxygen. In this case, incorporation of impurities from the atmosphere into the powder mixture can be suppressed. For example, argon, nitrogen, etc. may be used as the inert gas.

The atmosphere during mixing may be released to the air at some point in the mixing step. Even when the atmosphere is short of oxygen at some point in the mixing step, oxygen can be introduced from the air by releasing the atmosphere into the air, so that the shortage of oxygen can be mitigated.

1-2-3. Molding Method

No particular limitation is imposed on the method for molding the powder mixture produced as described above while the powder mixture is heated under pressure. For example, a hot pressing method, a hot isostatic pressing method (HIP method), a spark plasma sintering method (SPS method), etc. may be used. Preferably, when implementing the present invention, such a molding method is performed in a vacuum or an inert gas atmosphere. In this case, even when the powder mixture contains a certain amount of oxygen (other than oxygen of the metal oxide), the amount of oxygen (other than oxygen of the metal oxide) in the obtained sintered product decreases. The amount of impurities such as nitrogen in the obtained sintered product also decreases.

1-3. Effects

When the target is produced by casting, it is difficult to increase the contents of the metal oxide because of the solid solution limit of the metal oxide in the alloy, separation of the metal oxide from the alloy due to the difference in specific gravity, and the like.

Whereas, the production process in the first embodiment uses a sintering method, and thus can increase the content of the metal oxide based on the total amount of the target. More specifically, an FePt-based sputtering target containing a large amount of the metal oxide, for example, 20 vol % or more and 40 vol % or less, can be produced. Therefore, the use of the FePt-based sputtering target according to the first embodiment for spattering allows formation of a thin film containing an FePt alloy and being usable as a magnetic recording medium with the single target alone, i.e., without using a plurality of targets.

In the production process in the first embodiment, Fe is alloyed with Pt and Cu to form an FePtCu alloy powder, and thus the activity of Fe can be reduced even in the form of powder, thereby suppressing ignition and oxidation of Fe during mixing with the metal oxide powder.

When the atmosphere contains oxygen during the production of the powder mixture, it can prevent the metal oxide powder from being reduced during mixing and thus can prevent incorporation of metal originated from the metal oxide powder into the FePtCu alloy powder during mixing. Therefore, an FePt-based thin film produced by using the obtained FePt-based sputtering target is likely to exhibit stable magnetic recording characteristics.

2. Second Embodiment

An FePt-based sputtering target according to a second embodiment will be described below, but the description of the same content as in the FePt-based sputtering target according to the first embodiment will be appropriately omitted.

2-1. Components and Structure of Sputtering Target

The FePt-based sputtering target according to the first embodiment contains a metal oxide in addition to alloy components (Fe, Pt, Cu); whereas the FePt-based sputtering target according to the second embodiment contains C (carbon) and a metal oxide in addition to alloy components (Fe, Pt, Cu).

Specifically, the FePt-based sputtering target according to the second embodiment of the present invention contains Fe, Pt, C, and a metal oxide, and further contains one or more kinds of metal elements other than Fe and Pt, wherein the FePt-based sputtering target has a structure in which an FePtCu alloy phase, a C phase containing unavoidable impurities, and a metal oxide phase containing unavoidable impurities are mutually dispersed, the FePtCu alloy phase containing Pt in an amount of 40 at % or more and less than 60 at % and Cu in an amount of more than 0 at % and 20 at % or less with the balance being Fe and unavoidable impurities and with a total amount of Pt and Cu being 60 at % or less, and wherein the volume fraction of C to the total amount of the target is more than 0 vol % and 20 vol % or less, the volume fraction of the metal oxide to the total amount of the target is 10 vol % or more and less than 40 vol %, and the total volume fraction of C and the metal oxide to the total amount of the target is 20 vol % or more and 40 vol % or less.

2-1-1. FePtCu Alloy

In the FePt-based sputtering target according to the second embodiment of the present invention, Cu is contained in an FePt alloy to form an FePtCu alloy. The description of the FePtCu alloy in the FePt-based sputtering target according to the second embodiment to be mentioned here is overlapped with the content described in "1-1-1. FePtCu Alloy" in the first embodiment, and accordingly the description thereof will be omitted.

2-1-2. C and Metal Oxide

C and the metal oxide can form the partitions for separating the FePtCu alloy particles, which are magnetic particles, from each other in a layer containing the FePtCu alloy, C, and the metal oxide (hereinafter, may be referred to as an FePtCu—C-metal oxide layer) obtained by sputtering, and has a role in reducing and uniformizing the size of the FePtCu alloy particles in the FePtCu—C-metal oxide layer. C and the metal oxide are main components in the FePt-based sputtering target according to the second embodiment.

In the second embodiment, the content of C is more than 0 vol % and 20 vol % or less based on the total amount of the target, the content of the metal oxide is 10 vol % or more and less than 40 vol % based on the total amount of the target, and the total content of C and the metal oxide is 20 vol % or more and 40 vol % or less based on the total amount of the target.

The reason that the content of C is set to more than 0 vol % and 20 vol % or less based on the total amount of the target, the content of the metal oxide is set to 10 vol % or more and less than 40 vol % based on the total amount of the target, and the total content of C and the metal oxide is set to 20 vol % or more and 40 vol % or less based on the total amount of the target is that C and the metal oxide can form the partitions for separating the FePtCu alloy particles, which are magnetic particles, from each other in the FePtCu—C-metal oxide layer obtained by sputtering to achieve the effect of reducing and uniformizing the size of the FePtCu alloy particles. If the total content of C and the metal oxide is less than 20 vol %, this effect may not be sufficiently achieved. If the total content of C and the metal oxide is more than 40 vol %, the number of FePtCu alloy particles per unit volume of the FePtCu—C-metal oxide layer obtained by sputtering decreases, and this is disadvantageous for storage capacity.

The reason that the lower limit of the content of the metal oxide is set to 10 vol % based on the total amount of the target and the upper limit of the content of C is set to 20 vol % based on the total amount of the target is that, when the target contains a large amount of C and an insufficient amount of the metal oxide, C grows to surround the FePtCu alloy particles during sputtering. This may prevent the FePt alloy particles from growing vertically onto the substrate surface so that a plurality of the FePtCu alloy particles may be deposited vertically onto the substrate surface to deteriorate the characteristics as a magnetic recording medium. This can be avoided by containing 10 vol % or more (less than 40 vol %) of the metal oxide based on the total amount of the target and setting the upper limit of the content of C to 20 vol % based on the total amount of the target, making it possible to provide a favorable magnetic recording medium.

From the viewpoint of exhibiting the effect of reducing and uniformizing the size of the FePtCu particles in the FePtCu—C-metal oxide layer, from the viewpoint of the storage capacity of the FePtCu—C-metal oxide layer to be formed, and from the viewpoint of providing favorable characteristics as a magnetic recording medium, the content of C is preferably more than 0 vol % and 17 vol % or less based on the total amount of the target, the content of the metal oxide is preferably 13 vol % or more and less than 35 vol % based on the total amount of the target, and the total content of C and the metal oxide is preferably 25 vol % or more and 35 vol % or less based on the total amount of the target.

In the second embodiment, the metal oxide may contain, for example, at least one of $SiO_2$, $TiO_2$, $Ti_2O_3$, $Ta_2O_5$, $Cr_2O_3$, $CoO$, $CO_3O_4$, $B_2O_3$, $Fe_2O_3$, $CuO$, $Cu_2O$, $Y_2O_3$, $MgO$, $Al_2O_3$, $ZrO_2$, $Nb_2O_5$, $MoO_3$, $CeO_2$, $Sm_2O_3$, $Gd_2O_3$, $WO_2$, $WO_3$, $HfO_2$, and $NiO_2$.

2-1-3. Structure of Target

The FePt-based sputtering target according to the second embodiment has a structure in which an FePtCu alloy phase, a C phase containing unavoidable impurities, and a metal oxide phase containing unavoidable impurities are mutually dispersed, the FePtCu alloy phase containing Pt in an amount of 40 at % or more and less than 60 at % and Cu in an amount of more than 0 at % and 20 at % or less with the balance being Fe and unavoidable impurities and with the total amount of Pt and Cu being 60 at % or less, wherein the content of C is more than 0 vol % and 20 vol % or less based on the total amount of the target, the content of the metal oxide is 10 vol % or more and less than 40 vol % based on the total amount of the target, and the total content of C and the metal oxide is 20 vol % or more and 40 vol % or less based on the total amount of the target.

The reason that the FePt-based sputtering target according to the second embodiment has the structure in which the FePtCu alloy phase, the C phase, and the metal oxide phase are mutually dispersed is to prevent certain regions from being sputtered at an excessive high rate during sputtering to improve the sputtering.

It is preferable to reduce the size of the C phase and the metal oxide phase in the target as much as possible, in order to reduce the difference in sputtering rate at different positions. Therefore, the average size of the phase consisting of the C phase and the metal oxide phase in the target is preferably 0.4 μm or less as determined by the intercept method, more preferably 0.35 μm or less, and particularly preferably 0.3 μm or less.

In order to reduce the average size of the phase consisting of the C phase and the metal oxide phase in the target, the current size reduction technique requires extension of the time for mixing FePtCu alloy powder, C powder, and metal oxide powder. Therefore, it is unpractical to significantly reduce the average size of the phase consisting of the C phase and the metal oxide phase in the target with the current size reduction technique in terms of production efficiency. When the average size of the C phase and the metal oxide phase in the target is smaller to a certain extent, the problem associated with the difference in sputtering rate at different positions does not particularly occur. Therefore, the lower limit may be set on the average size of the C phase and the metal oxide phase in the target. When the lower limit is set, in consideration of the cost of the current size reduction technique, the average size of the phase consisting of the C phase and the metal oxide phase in the target, as determined by the intercept method, is preferably from 0.1 to 0.4 μm, more preferably from 0.15 to 0.35 μm, and particularly preferably from 0.2 to 0.3 μm.

A process for determining the average size of the phase consisting of the C phase and the metal oxide phase by the intercept method is the same as that described in the first embodiment except that the average size of the metal oxide phase is changed to the average size of the phase consisting of the C phase and the metal oxide phase, and accordingly the description of the process will be omitted. As used herein, the phase consisting of the C phase and the metal oxide phase refers to a phase picked out as the C phase and the metal oxide phase, not distinguishing between the C phase and the metal oxide phase and regarding them as a same phase.

In order to perform sputtering favorably, it is preferable that the relative density of the target be large because the larger the value of the relative density, the smaller the volume of voids in the target. More specifically, the relative density of the target is preferably 90% or higher. To increase the relative density of the target, it is preferable to mix the FePt alloy powder, the C powder, and the metal oxide powder sufficiently to reduce the particle size of the C powder and the metal oxide powder, as described later. The size of the C phase and the metal oxide phase in the target is thereby reduced, and the voids in the target can be filled by the plastic flow of the FePt alloy during sintering, so that the relative density increases.

The content of nitrogen is preferably 30 ppm by mass or less based on the total amount of the target. As the content of nitrogen in the target decreases, the content of nitrogen in the FePtCu—C-metal oxide layer to be obtained by sputtering also decreases, so that the FePtCu—C-metal oxide layer obtained is favorable.

2-2. Production Process

The FePt-based sputtering target according to the second embodiment can be produced by: adding C powder containing unavoidable impurities and metal oxide powder containing unavoidable impurities to FePtCu alloy powder containing Pt in an amount of 40 at % or more and less than 60 at % and Cu in an amount of more than 0 at % and 20 at % or less with the balance being Fe and unavoidable impurities and with the total amount of Pt and Cu being 60 at % or less, followed by mixing the FePtCu alloy powder, the C powder, and the metal oxide powder to produce a powder mixture; and molding the produced powder mixture while the powder mixture is heated under pressure.

In this production process, Fe, Pt, and Cu are supplied as the FePtCu alloy powder in the same manner as in the production process in the first embodiment, and are not supplied as a single powder of Fe, a single powder of Pt, and a single powder of Cu. A single powder of Fe has high activity and may ignite in the air. However, when Fe is alloyed with Pt and Cu to form an FePtCu alloy powder, the activity of Fe can be reduced even in the form of powder. For this reason, this production process can suppress oxidation and ignition of Fe during mixing with the C powder and metal oxide powder, and/or oxidation and ignition of Fe when a mixing container is open to the air after mixing.

When the atmosphere contains oxygen during the production of the powder mixture, it can prevent the metal oxide powder from being reduced during mixing and thus can prevent incorporation of metal originated from the metal oxide powder into the FePtCu alloy powder during mixing. Therefore, an FePt-based thin film produced by using the obtained FePt-based sputtering target is likely to exhibit stable magnetic recording characteristics.

In the second embodiment, the powder mixture contains C powder. When the atmosphere contains oxygen during the production of the powder mixture, a certain amount of oxygen is adsorbed to the surface of the C powder during mixing. Because a certain amount of oxygen has already been adsorbed to the surface of C particles, rapid adsorption of oxygen to the surface of the C particles and subsequent ignition of the C particles hardly occur even when a mixing container is opened to introduce the air after mixing, thereby allowing stable production even of the FePt-based sputtering target containing not only the metal oxide but also C.

2-2-1. Production of FePtCu Alloy Powder

No particular limitation is imposed on the process for producing the FePtCu alloy powder. However, in this embodiment, an atomizing method is performed using a molten FePtCu alloy containing Pt in an amount of 40 at % or more and less than 60 at % and Cu in an amount of more than 0 at % and 20 at % or less with the balance being Fe and unavoidable impurities and with the total amount of Pt and Cu being 60 at % or less to produce FePtCu alloy powder having the same composition as the molten alloy.

When the FePtCu alloy powder has the above composition, the FePtCu alloy phase in the target obtained by sintering of the FePtCu alloy powder has the above composition, so that the fct structure is likely to appear in an FePtCu phase in an FePtCu-metal oxide layer obtained by sputtering using the above target.

In the second embodiment, the FePtCu alloy powder is produced by an atomizing method. This atomizing method is the same as the atomizing method in the production process in the first embodiment except that the molten alloy contains a predetermined amount of Cu, and accordingly the description of the atomizing method in the second embodiment will be omitted.

2-2-2. Mixing

The powder mixture is produced by mixing the FePt alloy powder obtained by the atomizing method with the C powder having an average particle diameter of, for example, from 20 to 100 nm so that the content of C is more than 0 vol % and 20 vol % or less based on the total amount of the powder mixture, and further with the metal oxide powder having an average particle diameter of, for example, from 20 to 100 nm so that the content of the metal oxide is 10 vol % or more and less than 40 vol % based on the total amount of the powder mixture. The total content of C and the metal oxide is 20 vol % or more and 40 vol % or less based on the total amount of the powder mixture.

When the atmosphere contains oxygen during the production of the powder mixture, it can prevent the metal oxide powder from being reduced during mixing and thus can prevent incorporation of metal originated from the metal oxide powder into the FePt alloy powder. An FePt-based thin film produced by using the obtained FePt-based sputtering target is likely to exhibit stable magnetic recording characteristics.

From the viewpoint of preventing the metal oxide powder from being reduced during mixing, it is preferable that oxygen be continuously supplied from the outside of the mixing container to the atmosphere during mixing. Continuous supply of oxygen hardly causes a shortage of oxygen in the atmosphere and easily prevents the metal oxide powder from being reduced during mixing.

Also, from the viewpoint of avoiding ignition of the C particles even when the mixing container is opened to introduce the air after mixing, it is preferable that oxygen be continuously supplied from the outside of the mixing container to the atmosphere during mixing. When the atmosphere contains oxygen during the production of the powder mixture, a certain amount of oxygen has already been adsorbed to the surface of the C particles at the end of mixing. Therefore, rapid adsorption of oxygen to the surface of the C particles and subsequent ignition of the C particles hardly occur even when a mixing container is opened to introduce the air after mixing, thereby allowing stable production even of the FePt-based sputtering target according to the second embodiment containing not only the metal oxide but also C.

However, if the amount of oxygen in the atmosphere during mixing of the FePt alloy powder and the metal oxide powder is too large, the powder mixture may contain an excess amount of oxygen during mixing and the C particles may ignite during mixing.

From the viewpoint of preventing the metal oxide powder from being reduced during mixing, from the viewpoint of avoiding ignition of the C particles even when the mixing container is opened to introduce the air after mixing, and from the viewpoint that the powder mixture may contain an excess amount of oxygen during mixing and the C particles may ignite during mixing if the amount of oxygen in the atmosphere is too large, the concentration of oxygen in the atmosphere during mixing is preferably from 10 to 30 vol %, more preferably from 15 to 25 vol %, particularly preferably 19 to 22 vol %.

Oxygen may be supplied to the atmosphere during mixing by supplying air. This can reduce cost.

The atmosphere during mixing may be composed substantially of an inert gas and oxygen. In this case, incorporation of impurities from the atmosphere into the powder mixture can be suppressed. For example, argon, nitrogen, etc. may be used as the inert gas.

The atmosphere during mixing may be released to the air at some point in the mixing step. Even when the atmosphere is short of oxygen at some point in the mixing step, oxygen can be introduced from the air by releasing the atmosphere into the air, so that the shortage of oxygen can be mitigated.

2-2-3. Molding Method

A molding method in the second embodiment where the powder mixture produced as described above is molded while the powder mixture is heated under pressure is the same as the molding method in the production process in the first embodiment, and accordingly the description of the molding method will be omitted.

2-3. Effects

When the target is produced by casting, it is difficult to increase the contents of C and the metal oxide because of the solid solution limit of C and the metal oxide in the alloy, separation of C and the metal oxide from the alloy due to the difference in specific gravity, and the like.

Whereas, the production process in the second embodiment uses a sintering method and thus can increase the contents of C and the metal oxide based on the total amount of the target, making it possible to produce an FePt-based sputtering target in which the content of C is more than 0 vol % and 20 vol % or less based on the total amount of the target, the content of the metal oxide is 10 vol % or more and less than 40 vol % based on the total amount of the target, and the total content of C and the metal oxide is 20 vol % or more and 40 vol % or less based on the total amount of the target. Therefore, the use of the FePt-based sputtering target according to the second embodiment for spattering allows formation of a thin film containing an FePt-based alloy and being usable as a magnetic recording medium with the single target alone, i.e., without using a plurality of targets.

In the production process in the second embodiment, Fe is alloyed with Pt and Cu to form an FePtCu alloy powder in the same manner as in the production process of the first embodiment, and thus the activity of Fe can be reduced even in the form of powder, thereby suppressing ignition and oxidation of Fe during mixing with the C powder the metal oxide powder.

When the atmosphere contains oxygen during the production of the powder mixture, it can prevent the metal oxide powder from being reduced during mixing and thus can prevent incorporation of metal originated from the metal oxide powder into the FePtCu alloy powder during mixing. Therefore, an FePt-based thin film produced by using the obtained FePt-based sputtering target is likely to exhibit stable magnetic recording characteristics.

In the production process in the second embodiment, C powder is also used, and when the atmosphere contains oxygen during the production of the powder mixture, a certain amount of oxygen is adsorbed to the surface of the C powder during mixing. Because a certain amount of oxygen has already been adsorbed to the surface of the C particles, rapid adsorption of oxygen to the surface of the C particles and subsequent ignition of the C particles hardly occur even when the mixing container is opened to introduce the air after mixing, thereby allowing stable production even of the FePt-based sputtering target according to the second embodiment containing not only the metal oxide but also C.

EXAMPLES

Reference Example 1

The targeted composition of a powder mixture and a target in Reference Example 1 is (50Fe-50Pt)-30 vol % $SiO_2$. More specifically, the targeted composition of the metal components is 50 at % Fe-50 at % Pt, and the targeted content of the metal oxide ($SiO_2$) is 30 vol % based on the total amount of the target. When the content of the metal oxide ($SiO_2$) is represented not by vol % but by mol %, the targeted composition of the powder mixture and the target in Reference Example 1 is (50Fe-50Pt)-11.27 mol % $SiO_2$.

The metals in bulk form were weighed such that the composition of the alloy was Fe: 50 at % and Pt: 50 at % and then heated by high frequency heating to form a molten Fe—Pt alloy at 1,800° C. Then a gas atomizing method using argon gas was performed to produce 50 at % Fe-50 at % Pt alloy powder. The average particle diameter of the obtained alloy powder was measured using Microtrac MT3000 manufactured by NIKKISO Co., Ltd. and found to be 50 μm.

66.91 g of $SiO_2$ powder having an average particle diameter of 0.7 μm and a bulk density of 2.20 $g/cm^3$ was added to 1100.00 g of the obtained 50 at % Fe-50 at % Pt alloy powder such that the content of $SiO_2$ was 30 vol % based on the total amount of the powders, and then these components were mixed using a ball mill until the cumulative number of revolutions reached 3,741,120 to thereby produce a powder mixture. Hereinafter, the cumulative number of revolutions of the ball mill may be referred to as the cumulative number of ball mill revolutions or simply as the number of revolutions.

During mixing, the mixing container was hermetically closed with a lid and filled with a gas mixture ($Ar+O_2$), and under the atmosphere in the mixing container, the 50 at % Fe-50 at % Pt alloy powder and $SiO_2$ powder were mixed.

When the cumulative number of ball mill revolutions reached 935,280, 1,870,560, 2,805,840 and 3,741,120, the mixing container was opened, and whether or not ignition had occurred was visually checked. However, no ignition was found at each point.

When the cumulative number of ball mill revolutions reached 1,870,560, 2,805,840, and 3,741,120, 30.00 g of the powder mixtures were subjected to hot pressing in a vacuum atmosphere at less than 20 Pa to produce disc-like sintered products having a diameter of 30 mm. The hot-pressing conditions (sintering temperature, sintering pressure, and sintering time) and the relative densities of the obtained sintered products are shown in TABLE 1 below. The theoretical density of the sintered product is 11.51 g/cm$^3$.

TABLE 1

| Cumulative number of ball mill revolutions (Number) | Hot-pressing conditions | | | Relative density of sintered product (%) | Ignition |
| --- | --- | --- | --- | --- | --- |
| | Sintering temperature (° C.) | Sintering pressure (MPa) | Sintering time (min) | | |
| 935,280 | — | — | — | — | — |
| 1,870,560 | 1070 | 26.2 | 45 | 96.96 | NO |
| 2,805,840 | 1070 | 26.2 | 45 | 97.03 | NO |
| 3,741,120 | 1050 | 26.2 | 45 | 98.61 | NO |

The relative densities of the sintered products exceed 96%, and the amount of voids in the obtained sintered products was small.

The contents of oxygen and nitrogen in the powder mixture taken at a cumulative number of ball mill revolutions of 3,741,120 were measured using a TC-600 Series Nitrogen/Oxygen Determinator manufactured by LECO Corporation. The contents of oxygen and nitrogen in the sintered product made using the powder mixture taken at a cumulative number of ball mill revolutions of 3,741,120 were measured using a TC-600 Series Nitrogen/Oxygen Determinator manufactured by LECO Corporation. The measurement results are shown in TABLE 2 below.

TABLE 2

| Cumulative number of ball mill revolutions of 3,741,120 | Oxygen (mass %) | Nitrogen (mass ppm) |
| --- | --- | --- |
| Powder mixture | 3.36 | 42 |
| Sintered product | 3.21 | 19 |

The content of oxygen and the content of nitrogen in the sintered product both decrease compared to those in the powder mixture, while the degree of reduction in the content of oxygen is smaller than the degree of reduction in the content of nitrogen. This may be caused by the fact that the powder mixture and the sintered product both contain metal oxide $SiO_2$.

Figure 2:
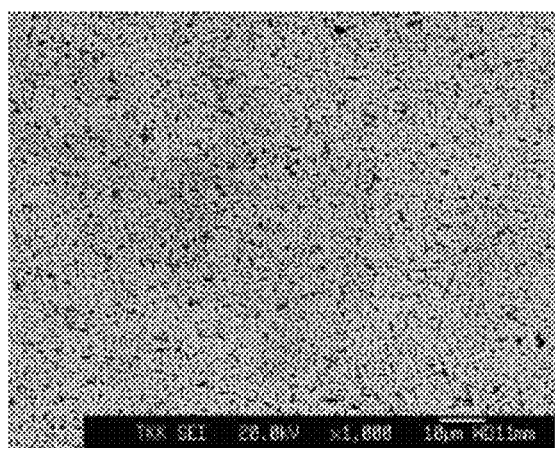
FIG. 2 is a SEM photograph of a sintered product in Reference Example 1 (an image taken at a magnification of 1,000×; a bar scale in the photograph represents 10 μm).
Figure 3:
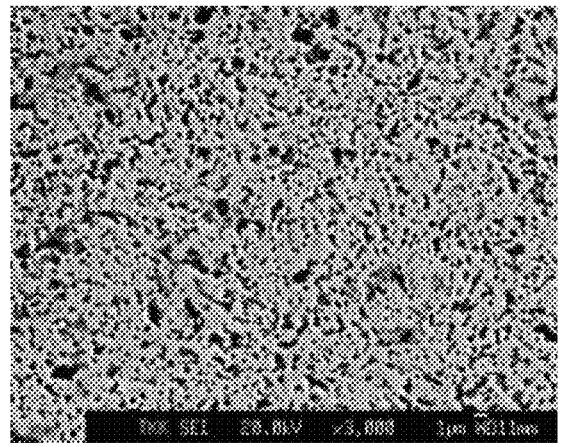
FIG. 3 is a SEM photograph of a sintered product in Reference Example 1 (an image taken at a magnification of 3,000×; a bar scale in the photograph represents 1 μm).
Figure 4:
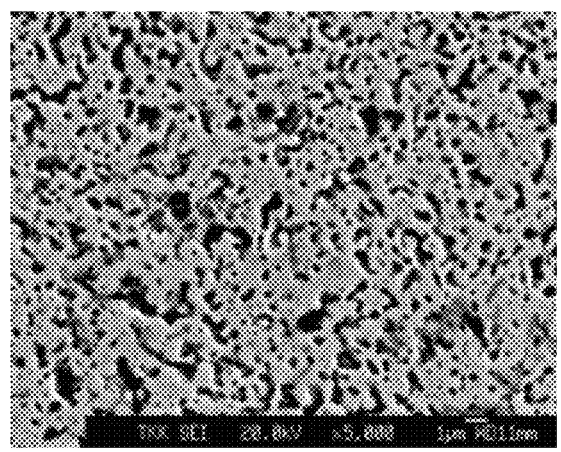
FIG. 4 is a SEM photograph of a sintered product in Reference Example 1 (an image taken at a magnification of 5,000×; a bar scale in the photograph represents 1 μm).
Figure 5:
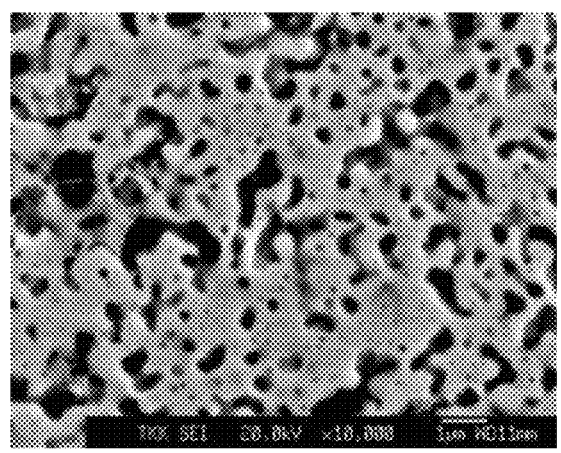
FIG. 5 is a SEM photograph of a sintered product in Reference Example 1 (an image taken at a magnification of 10,000×; a bar scale in the photograph represents 1 μm).

The structure of the sintered product made using the powder mixture taken at a cumulative number of ball mill revolutions of 3,741,120 was observed under a scanning electron microscope (SEM). FIGS. 2 to 5 show SEM photographs of the sintered products. FIG. 2 is a SEM photograph taken at a magnification of 1,000× (a bar scale in the photograph represents 10 μm). FIG. 3 is a SEM photograph taken at a magnification of 3,000× (a bar scale in the photograph represents 1 μm). FIG. 4 is a SEM photograph taken at a magnification of 5,000× (a bar scale in the photograph represents 1 μm). FIG. 5 is a SEM photograph taken at a magnification of 10,000× (a bar scale in the photograph represents 1 μm). In FIGS. 2 to 5, black portions correspond to the $SiO_2$ phase, and white portions correspond to the FePt alloy phase. As can be seen from FIGS. 2 to 5, fine regions of the $SiO_2$ phase are dispersed in the entire area of the structure.

The average size of the $SiO_2$ phase was determined by the intercept method based on the SEM photograph of FIG. 5 taken at a magnification of 10,000×.

Specifically, two horizontal lines were drawn in a left-right direction on the SEM photograph of FIG. 5 so that the image was divided vertically into three parts, and three vertical lines were drawn in a vertical direction so that the image was divided horizontally into four parts. Thus, a total of five lines are drawn on the SEM photograph of FIG. 5.

For each of the five lines, the total length of line segments intersecting the $SiO_2$ phase and the number of the $SiO_2$ phase intersected by the line were determined. Then the average of the lengths of the segments of the five lines that intersected the $SiO_2$ phase was determined (by dividing the total length of the line segments intersecting the $SiO_2$ phase by the number of the $SiO_2$ phases intersected by the lines), and the obtained value was used as the average size of the $SiO_2$ phase determined by the intercept method. The results showed that the average size of the $SiO_2$ phase determined by the intercept method was 0.34 μm.

Reference Example 2

The targeted composition of a powder mixture and a target in Reference Example 2 is (50Fe-50Pt)-30 vol % $TiO_2$. More specifically, the targeted composition of the metal components is 50 at % Fe-50 at % Pt, and the targeted content of the metal oxide ($TiO_2$) is 30 vol % based on the total amount of the target. When the content of the metal oxide ($TiO_2$) is represented not by vol % but by mol %, the targeted composition of the powder mixture and the target in Reference Example 2 is (50Fe-50Pt)-15.34 mol % $TiO_2$.

To 1100.00 g of 50 at % Fe-50 at % Pt alloy powder produced in the same manner as in Reference Example 1, 126.85 g of $TiO_2$ powder having an average particle diameter of 0.07 μm and a bulk density of 4.11 g/cm$^3$ was added so that the content of $TiO_2$ was 30 vol % based on the total amount of the powders. These components were then mixed with a ball mill until the cumulative number of revolutions reached 3,741,120 to produce a powder mixture.

During mixing, the mixing container was hermetically closed with a lid and filled with a gas mixture (Ar+$O_2$), and under the atmosphere in the mixing container, the 50 at % Fe-50 at % Pt alloy powder and $TiO_2$ powder were mixed.

When the cumulative number of ball mill revolutions reached 935,280, 1,870,560, 2,805,840 and 3,741,120, the mixing container was opened, and whether or not ignition had occurred was visually checked. However, no ignition was found at each point.

When the cumulative number of ball mill revolutions reached 1,870,560, 2,805,840, and 3,741,120, 30.00 g of the powder mixtures were subjected to hot pressing in a vacuum atmosphere at less than 20 Pa to produce disc-like sintered products having a diameter of 30 mm. The hot-pressing conditions (sintering temperature, sintering pressure, and sintering time) and the relative densities of the obtained sintered products are shown in TABLE 3 below. The theoretical density of the sintered product is 12.10 g/cm$^3$.

TABLE 3

| Cumulative number of ball mill revolutions (Number) | Hot-pressing conditions | | | Relative density of sintered product (%) | Ignition |
| --- | --- | --- | --- | --- | --- |
| | Sintering temperature (° C.) | Sintering pressure (MPa) | Sintering time (min) | | |
| 935,280 | — | — | — | — | — |
| 1,870,560 | 1000 | 26.2 | 45 | 97.54 | NO |
| 2,805,840 | 960 | 26.2 | 45 | 96.97 | NO |
| 3,741,120 | 950 | 26.2 | 45 | 96.69 | NO |

The relative densities of the sintered products exceed 96%, and the amount of voids in the obtained sintered products was small.

The contents of oxygen and nitrogen in the powder mixture taken at a cumulative number of ball mill revolutions of 3,741,120 were measured using a TC-600 Series Nitrogen/Oxygen Determinator manufactured by LECO Corporation. The contents of oxygen and nitrogen in the sintered product made using the powder mixture taken at a cumulative number of ball mill revolutions of 3,741,120 were measured using a TC-600 Series Nitrogen/Oxygen Determinator manufactured by LECO Corporation. The measurement results are shown in TABLE 4 below.

TABLE 4

| Cumulative number of ball mill revolutions of 3,741,120 | Oxygen (mass %) | Nitrogen (mass ppm) |
| --- | --- | --- |
| Powder mixture | 4.52 | 46 |
| Sintered product | 3.96 | 31 |

The content of oxygen and the content of nitrogen in the sintered product both decrease compared to those in the powder mixture, while the degree of reduction in the content of oxygen is smaller than the degree of reduction in the content of nitrogen. This may be caused by the fact that the powder mixture and the sintered product both contain metal oxide $TiO_2$.

Figure 6:
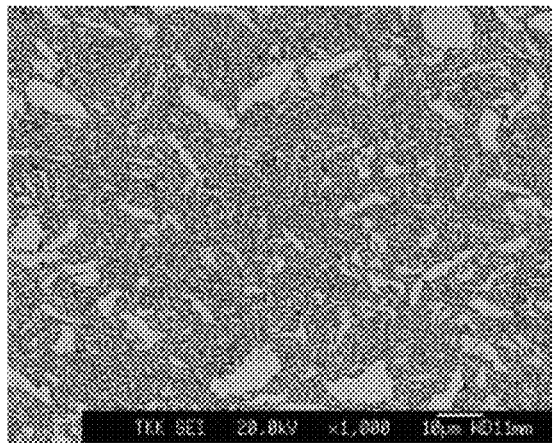
FIG. 6 is a SEM photograph of a sintered product in Reference Example 2 (an image taken at a magnification of 1,000×; a bar scale in the photograph represents 10 μm).
Figure 7:
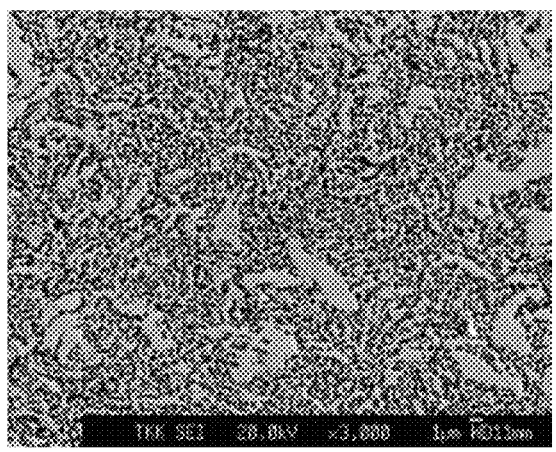
FIG. 7 is a SEM photograph of a sintered product in Reference Example 2 (an image taken at a magnification of 3,000×; a bar scale in the photograph represents 1 μm).
Figure 8:
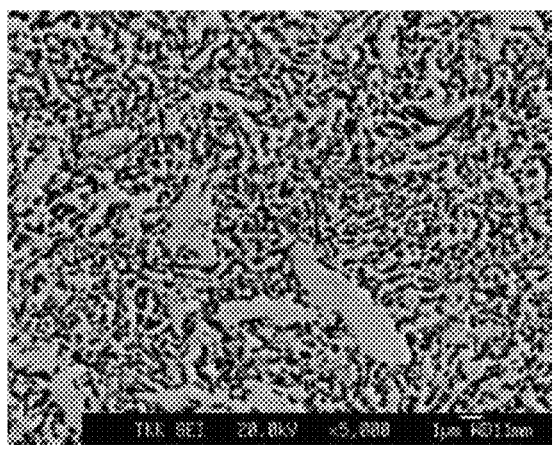
FIG. 8 is a SEM photograph of a sintered product in Reference Example 2 (an image taken at a magnification of 5,000×; a bar scale in the photograph represents 1 μm).
Figure 9:
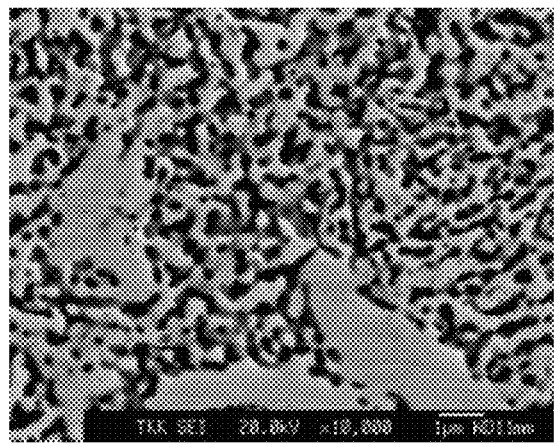
FIG. 9 is a SEM photograph of a sintered product in Reference Example 2 (an image taken at a magnification of 10,000×; a bar scale in the photograph represents 1 μm).

The structure of the sintered product made using the powder mixture taken at a cumulative number of ball mill revolutions of 3,741,120 was observed under a scanning electron microscope (SEM). FIGS. 6 to 9 show SEM photographs of the sintered products. FIG. 6 is a SEM photograph taken at a magnification of 1,000× (a bar scale in the photograph represents 10 μm). FIG. 7 is a SEM photograph taken at a magnification of 3,000× (a bar scale in the photograph represents 1 μm). FIG. 8 is a SEM photograph taken at a magnification of 5,000× (a bar scale in the photograph represents 1 μm). FIG. 9 is a SEM photograph taken at a magnification of 10,000× (a bar scale in the photograph represents 1 μm). In FIGS. 6 to 9, black portions correspond to the $TiO_2$ phase, and white portions correspond to the FePt alloy phase. As can be seen from FIGS. 6 to 9, fine regions of the $TiO_2$ phase are dispersed in the entire area of the structure.

The average size of the $TiO_2$ phase was determined by the intercept method based on the SEM photograph of FIG. 9 taken at a magnification of 10,000×. A specific method is the same as the method of Reference Example 1.

The results showed that the average size of the $TiO_2$ phase determined by the intercept method was 0.28 μm.

Reference Example 3

The targeted composition of a powder mixture and a target in Reference Example 3 is (50Fe-50Pt)-36.63 vol % $B_2O_3$. More specifically, the targeted composition of the metal components is 50 at % Fe-50 at % Pt, and the targeted content of the metal oxide ($B_2O_3$) is 36.63 vol % based on the total amount of the target. When the content of the metal oxide ($B_2O_3$) is represented not by vol % but by mol %, the targeted composition of the powder mixture and the target in Reference Example 3 is (50Fe-50Pt)-11 mol % $B_2O_3$.

To 1100.00 g of 50 at % Fe-50 at % Pt alloy powder produced in the same manner as in Reference Example 1, 75.44 g of $B_2O_3$ powder was added so that the content of $B_2O_3$ was 36.63 vol % based on the total amount of the powders. These components were then mixed with a ball mill until the cumulative number of revolutions reached 5,736,960 to produce a powder mixture.

During mixing, the mixing container was hermetically closed with a lid and filled with a gas mixture (Ar+$O_2$), and under the atmosphere in the mixing container, the 50 at % Fe-50 at % Pt alloy powder and $B_2O_3$ powder were mixed.

When the cumulative number of ball mill revolutions reached 935,280, 2,535,840, 4,136,400 and 5,736,960, the mixing container was opened, and whether or not ignition had occurred was visually checked. However, no ignition was found at each point.

When the cumulative number of ball mill revolutions reached 4,136,400 and 5,736,960, 30.00 g of the powder mixtures were subjected to hot pressing in a vacuum atmosphere at less than 20 Pa to produce disc-like sintered products having a diameter of 30 mm. The hot-pressing conditions (sintering temperature, sintering pressure, and sintering time) and the relative densities of the obtained sintered products are shown in TABLE 5 below. The theoretical density of the sintered product is 10.50 g/cm³. According to calculation based on the theoretical density of this sintered product of 10.50 g/cm³, the relative densities of the sintered products were 103.95% (cumulative number of ball mill revolutions: 4,136,400) and 105.22% (cumulative number of ball mill revolutions: 5,736,960) as shown in TABLE 5 below.

TABLE 5

| Cumulative number of ball mill revolutions (Number) | Hot-pressing conditions | | | Relative density of sintered product (%) | Ignition |
| --- | --- | --- | --- | --- | --- |
| | Sintering temperature (° C.) | Sintering pressure (MPa) | Sintering time (min) | | |
| 935,280 | — | — | — | — | NO |
| 2,535,840 | — | — | — | — | NO |
| 4,136,400 | 810 | 26.2 | 45 | 103.95 | NO |
| 5,736,960 | 840 | 26.2 | 45 | 105.22 | NO |

The relative density of the sintered product is 105.22%, or over 100%, and the amount of voids in the obtained sintered products was small.

The contents of oxygen and nitrogen in the sintered product made using the powder mixture taken at a cumulative number of ball mill revolutions of 5,736,960 were measured using a TC-600 Series Nitrogen/Oxygen Determinator manufactured by LECO Corporation. The measurement results are shown in TABLE 6 below.

TABLE 6

| Cumulative number of ball mill revolutions of 5,736,960 | Oxygen (mass %) | Nitrogen (mass ppm) |
|---|---|---|
| Sintered product | 4.83 | 35 |

The contents of Fe, Pt, and B in the sintered product made of the powder mixture taken at a cumulative number of ball mill revolutions of 5,736,960 were analyzed by ICP. TABLE 7 below shows the analysis results as well as the contents of Fe, Pt, and B in the powder mixture before sintering. The contents of Fe, Pt, and B in the powder mixture before sintering are not the analysis results by ICP but the calculated values (theoretical values) based on the amounts of raw material powders blended for producing the powder mixture.

TABLE 7

| Cumulative number of ball mill revolutions of 5,736,960 | Fe (mass %) | Pt (mass %) | B (mass %) |
|---|---|---|---|
| Powder mixture | 20.83 | 72.75 | 1.99 |
| Sintered product | 19.76 | 72.99 | 2.02 |

Figure 10:
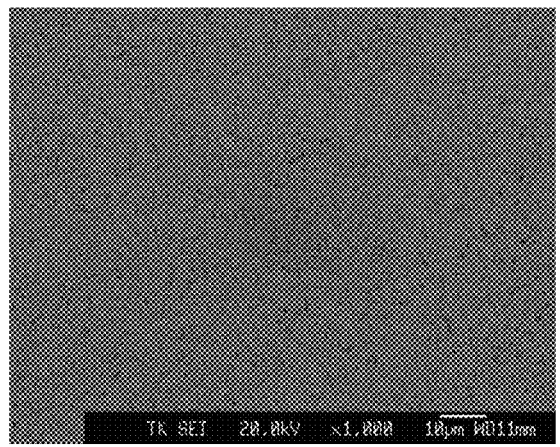
FIG. 10 is a SEM photograph of a sintered product in Reference Example 3 (an image taken at a magnification of 1,000×; a bar scale in the photograph represents 10 μm).
Figure 11:
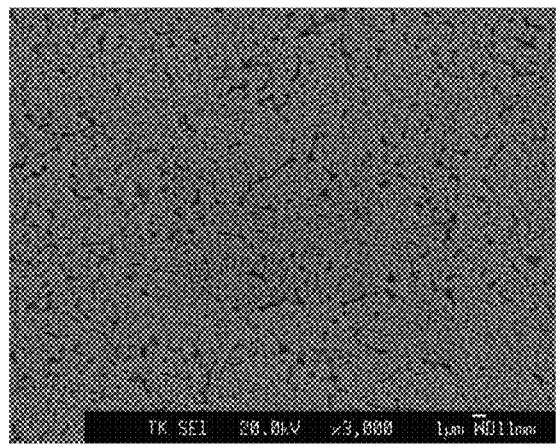
FIG. 11 is a SEM photograph of a sintered product in Reference Example 3 (an image taken at a magnification of 3,000×; a bar scale in the photograph represents 1 μm).
Figure 12:
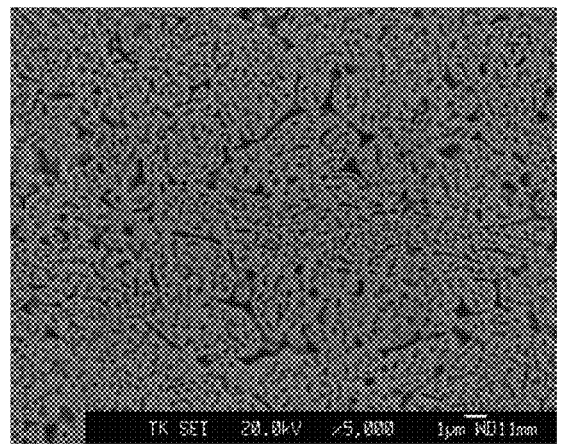
FIG. 12 is a SEM photograph of a sintered product in Reference Example 3 (an image taken at a magnification of 5,000×; a bar scale in the photograph represents 1 μm).
Figure 13:
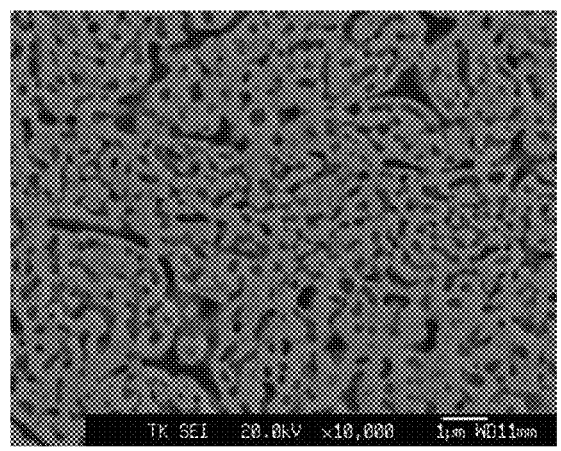
FIG. 13 is a SEM photograph of a sintered product in Reference Example 3 (an image taken at a magnification of 10,000×; a bar scale in the photograph represents 1 μm).

The structure of the sintered product made using the powder mixture taken at a cumulative number of ball mill revolutions of 5,736,960 was observed under a scanning electron microscope (SEM). FIGS. 10 to 13 show SEM photographs of the sintered products. FIG. 10 is a SEM photograph taken at a magnification of 1,000× (a bar scale in the photograph represents 10 μm). FIG. 11 is a SEM photograph taken at a magnification of 3,000× (a bar scale in the photograph represents 1 μm). FIG. 12 is a SEM photograph taken at a magnification of 5,000× (a bar scale in the photograph represents 1 μm). FIG. 13 is a SEM photograph taken at a magnification of 10,000× (a bar scale in the photograph represents 1 μm). In FIGS. 10 to 13, black portions correspond to the $B_2O_3$ phase, and gray portions correspond to the FePt alloy phase. As can be seen from FIGS. 10 to 13, fine regions of the $B_2O_3$ phase are dispersed in the entire area of the structure.

The average size of the $B_2O_3$ phase was determined by the intercept method based on the SEM photograph of FIG. 13 taken at a magnification of 10,000×. A specific method is the same as the method of Reference Example 1.

The results showed that the average size of the $B_2O_3$ phase determined by the intercept method was 0.22 μm.

Reference Example 4

The targeted composition of a powder mixture and a target in Reference Example 4 is (50Fe-50Pt)-12.07 vol % $B_2O_3$-24.68 vol % $SiO_2$. That is, the targeted composition of metal components is 50 at % Fe-50 at % Pt; the targeted content of metal oxide $B_2O_3$ is 12.07 vol % based on the total amount of the target; and the targeted content of metal oxide $SiO_2$ is 24.68 vol % based on the total amount of the target. When the contents of $B_2O_3$ and $SiO_2$ are represented not by vol % but by mol %, the targeted composition of the powder mixture and the target in Reference Example 4 is (50Fe-50Pt)-3.53 mol % $B_2O_3$-10 mol % $SiO_2$.

To 970.00 g of 50 at % Fe-50 at % Pt alloy powder produced in the same manner as in Reference Example 1, 21.97 g of $B_2O_3$ powder was added so that the content of $B_2O_3$ is 12.07 vol % based on the total amount of the powders, and 53.72 g of $SiO_2$ powder having an average particle diameter of 0.7 μm and a bulk density of 2.20 g/cm³ was added so that the content of $SiO_2$ was 24.68 vol % based on the total amount of the powders. These components were then mixed with a ball mill until the cumulative number of revolutions reached 3,852,360 to produce a powder mixture.

During mixing, the mixing container was hermetically closed with a lid and filled with a gas mixture ($Ar+O_2$); and under the atmosphere in the mixing container, the 50 at % Fe-50 at % Pt alloy powder, the $B_2O_3$ powder, and the $SiO_2$ powder were mixed.

When the cumulative number of ball mill revolutions reached 1,046,520, 1,981,800, 2,917,080 and 3,852,360, the mixing container was opened, and whether or not ignition had occurred was visually checked. However, no ignition was found at each point.

When the cumulative number of ball mill revolution reached 3,852,360, 30.00 g of the powder mixture was subjected to hot pressing in a vacuum atmosphere at less than 20 Pa to produce a disc-like sintered product having a diameter of 30 mm. The hot-pressing conditions (sintering temperature, sintering pressure, and sintering time) and the relative density of the obtained sintered product are shown in TABLE 8 below. If there is no difference between the amounts of B and Si contained in the powder mixture before sintering and those contained in the sintered product after sintering, the theoretical density of the sintered product is 10.57 g/cm³. As a result of the analysis of the sintered product by ICP, the content of B decreased by 0.01% by mass compared to the powder mixture before sintering, and the content of Si decreased by 0.04% by mass compared to the powder mixture before sintering (see, TABLE 10). Considering this and assuming that all B in the sintered product was $B_2O_3$ and all Si in the sintered product was $SiO_2$, the theoretical density of the sintered product was calculated and found to be 10.59 g/cm³. Based on the theoretical density of this sintered product of 10.59 g/cm³, the relative density of the sintered product was calculated and found to be 100.38% as shown in TABLE 8 below.

TABLE 8

| Cumulative number of ball mill revolutions (Number) | Hot-pressing conditions | | | Relative density of sintered product (%) | Ignition |
|---|---|---|---|---|---|
| | Sintering temperature (° C.) | Sintering pressure (MPa) | Sintering time (min) | | |
| 1,046,520 | — | — | — | — | NO |
| 1,981,800 | — | — | — | — | NO |
| 2,917,080 | — | — | — | — | NO |
| 3,852,360 | 830 | 26.2 | 45 | 100.38 | NO |

The relative density of the sintered product was about 100%, and the amount of voids in the obtained sintered product was small. The relative density of the sintered product shown in TABLE 8 above is 100.38%, or over 100%. This is regarded as measurement error.

The contents of oxygen and nitrogen in the sintered product made using the powder mixture taken at a cumulative number of ball mill revolutions of 3,852,360 were measured using a TC-600 Series Nitrogen/Oxygen Determinator manufactured by LECO Corporation. The measurement results are shown in TABLE 9 below.

TABLE 9

| Cumulative number of ball mill revolutions of 3,852,360 | Oxygen (mass %) | Nitrogen (mass ppm) |
|---|---|---|
| Sintered product | 4.19 | 25 |

The contents of Fe, Pt, B, and Si in the sintered product made of the powder mixture taken at a cumulative number of ball mill revolutions of 3,852,360 were analyzed by ICP. TABLE 10 below shows the analysis results as well as the contents of Fe, Pt, B, and Si in the powder mixture before sintering.

TABLE 10

| Cumulative number of ball mill revolutions of 3,852,360 | Fe (mass %) | Pt (mass %) | B (mass %) | Si (mass %) |
|---|---|---|---|---|
| Powder mixture | 20.64 | 72.12 | 0.65 | 2.40 |
| Sintered product | 21.24 | 71.67 | 0.64 | 2.36 |

Figure 14:
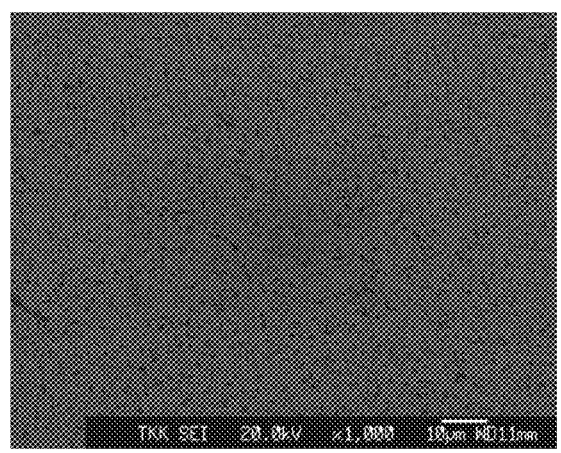
FIG. 14 is a SEM photograph of a sintered product in Reference Example 4 (an image taken at a magnification of 1,000×; a bar scale in the photograph represents 10 μm).
Figure 15:
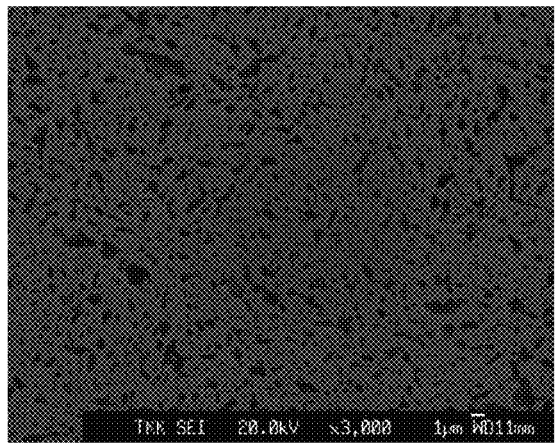
FIG. 15 is a SEM photograph of a sintered product in Reference Example 4 (an image taken at a magnification of 3,000×; a bar scale in the photograph represents 1 μm).
Figure 16:
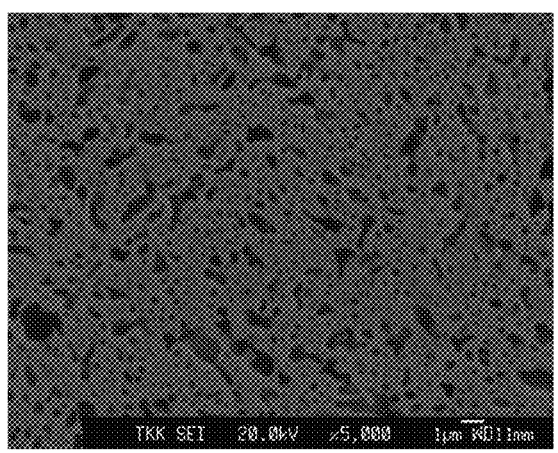
FIG. 16 is a SEM photograph of a sintered product in Reference Example 4 (an image taken at a magnification of 5,000×; a bar scale in the photograph represents 1 μm).
Figure 17:
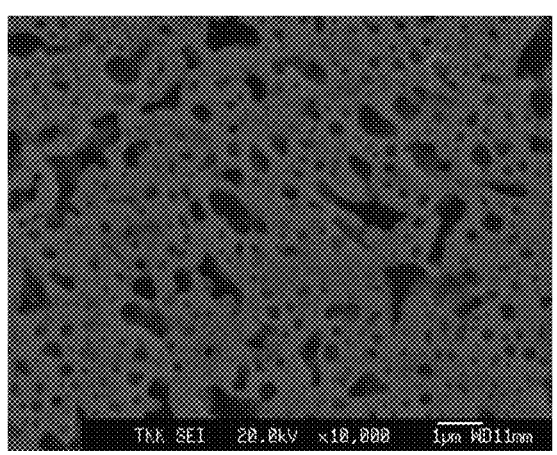
FIG. 17 is a SEM photograph of a sintered product in Reference Example 4 (an image taken at a magnification of 10,000×; a bar scale in the photograph represents 1 μm).

The structure of the sintered product made using the powder mixture taken at a cumulative number of ball mill revolutions of 3,852,360 was observed under a scanning electron microscope (SEM). FIGS. 14 to 17 show SEM photographs of the sintered products. FIG. 14 is a SEM photograph taken at a magnification of 1,000× (a bar scale in the photograph represents 10 μm). FIG. 15 is a SEM photograph taken at a magnification of 3,000× (a bar scale in the photograph represents 1 μm). FIG. 16 is a SEM photograph taken at a magnification of 5,000× (a bar scale in the photograph represents 1 μm). FIG. 17 is a SEM photograph taken at a magnification of 10,000× (a bar scale in the photograph represents 1 μm). In FIGS. 14 to 17, black portions correspond to the metal oxide phase (the $B_2O_3$ phase and the $SiO_2$ phase), and gray portions correspond to the FePt alloy phase. As can be seen from FIGS. 14 to 17, fine regions of the metal oxide phase (the $B_2O_3$ phase and the $SiO_2$ phase) are dispersed in the entire area of the structure.

The average size of the metal oxide phase (the phase consisting of the $B_2O_3$ phase and the $SiO_2$ phase) was determined by the intercept method based on the SEM photograph of FIG. 17 taken at a magnification of 10,000×. A specific method is the same as the method of Reference Example 1.

The results showed that the average size of the metal oxide phase (the phase consisting of the $B_2O_3$ phase and the $SiO_2$ phase) determined by the intercept method was 0.27 μm.

Reference Example 5

The targeted composition of a powder mixture and a target in Reference Example 5 is (50Fe-50Pt)-6 vol % C-24 vol % $SiO_2$. That is, the targeted composition of metal components is 50 at % Fe-50 at % Pt; the targeted content of C is 6 vol % based on the total amount of the target; and the targeted content of metal oxide ($SiO_2$) is 24 vol % based on the total amount of the target. When the contents of C and metal oxide ($SiO_2$) are represented not by vol % but by mol %, the targeted composition of the powder mixture and the target in Reference Example 5 is (50Fe-50Pt)-10.60 mol % C-8.25 mol % $SiO_2$.

To 1100.00 g of 50 at % Fe-50 at % Pt alloy powder produced in the same manner as in Reference Example 1, 13.72 g of C powder having an average particle diameter of 35 μm and a bulk density of 0.25 g/cm³ was added so that the content of C is 5.7 vol % based on the total amount of the powders, and 53.44 g of $SiO_2$ powder having an average particle diameter of 0.7 μm and a bulk density of 2.20 g/cm³ was added so that the content of $SiO_2$ was 23.4 vol % based on the total amount of the powders. These components were then mixed with a ball mill until the cumulative number of revolutions reached 3,741,120 to produce a powder mixture.

During mixing, the mixing container was hermetically closed with a lid and filled with a gas mixture (Ar+$O_2$); and under the atmosphere in the mixing container, the 50 at % Fe-50 at % Pt alloy powder, the C powder, and the $SiO_2$ powder were mixed.

When the cumulative number of ball mill revolutions reached 935,280, 1,870,560, 2,805,840 and 3,741,120, the mixing container was opened, and whether or not ignition had occurred was visually checked. However, no ignition was found at each point.

When the cumulative number of ball mill revolution reached 3,741,120, 30.00 g of the powder mixture was subjected to hot pressing in a vacuum atmosphere at less than 20 Pa to produce a disc-like sintered product having a diameter of 30 mm. The hot-pressing conditions (sintering temperature, sintering pressure, and sintering time) and the relative density of the obtained sintered product are shown in TABLE 11 below. The theoretical density of the sintered product is 11.51 g/cm³, which is calculated in consideration of a reduction in the amount of carbon during mixing and sintering (i.e., calculated using the content of carbon in the sintered product shown in TABLE 12). Based on this theoretical density, the relative density of the sintered product was calculated.

TABLE 11

| Cumulative number of ball mill revolutions (Number) | Hot-pressing conditions | | | Relative density of sintered product (%) | Ignition |
|---|---|---|---|---|---|
| | Sintering temperature (° C.) | Sintering pressure (MPa) | Sintering time (min) | | |
| 935,280 | — | — | — | — | NO |
| 1,870,560 | — | — | — | — | NO |
| 2,805,840 | — | — | — | — | NO |
| 3,741,120 | 1270 | 24.5 | 45 | 97.31 | NO |

The relative density of the sintered product exceeds 97%, and the amount of voids in the obtained sintered product was small.

The contents of oxygen and nitrogen in the powder mixture taken at a cumulative number of ball mill revolutions of 3,741,120 were measured using a TC-600 Series Nitrogen/Oxygen Determinator manufactured by LECO Corporation, and the content of carbon was measured using a Carbon/Sulfur Analyzer manufactured by HORIBA, Ltd. The contents of oxygen and nitrogen in the sintered product made using the powder mixture taken at a cumulative number of ball mill revolutions of 3,741,120 were measured using a TC-600 Series Nitrogen/Oxygen Determinator manufactured by LECO Corporation, and the content of carbon was measured using a Carbon/Sulfur Analyzer manufactured by HORIBA, Ltd. The measurement results are shown in TABLE 12 below.

TABLE 12

| Cumulative number of ball mill revolutions of 3,741,120 | Oxygen (mass %) | Nitrogen (mass ppm) | Carbon (mass %) |
|---|---|---|---|
| Powder mixture | 1.56 | 130 | 3.27 |
| Sintered product | 1.06 | 10 | 2.18 |

The content of oxygen and the content of nitrogen in the sintered product both decrease compared to those in the powder mixture, while the degree of reduction in the content of oxygen is smaller than the degree of reduction in the content of nitrogen. This may be caused by the fact that the powder mixture and the sintered product both contain metal oxide $SiO_2$.

As comparing the content of oxygen and the content of nitrogen in the sintered product with those in the powder mixture, the degree of reduction in the content of oxygen and the content of nitrogen due to sintering in Reference Example 5 is larger than that in Reference Examples 1 and 2. This may be because the powder mixture of Reference Example 5 contains the C powder and thus oxygen and nitrogen have been adsorbed to the surface of the C powder.

Figure 18:
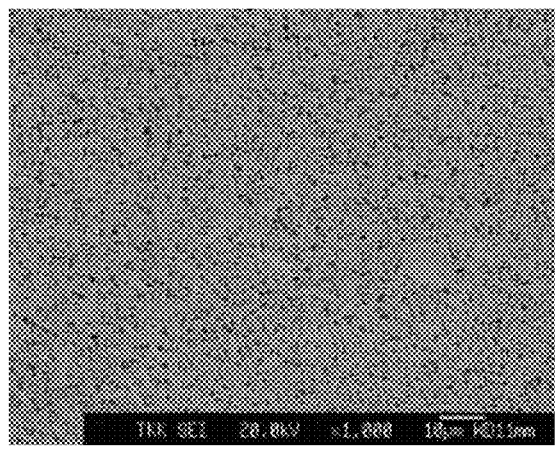
FIG. 18 is a SEM photograph of a sintered product in Reference Example 5 (an image taken at a magnification of 1,000×; a bar scale in the photograph represents 10 μm).
Figure 19:
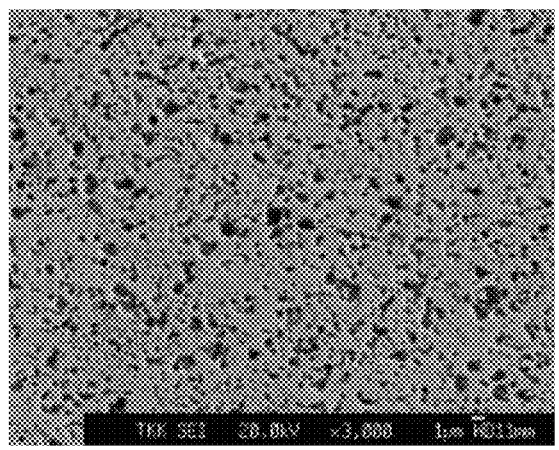
FIG. 19 is a SEM photograph of a sintered product in Reference Example 5 (an image taken at a magnification of 3,000×; a bar scale in the photograph represents 1 μm).
Figure 20:
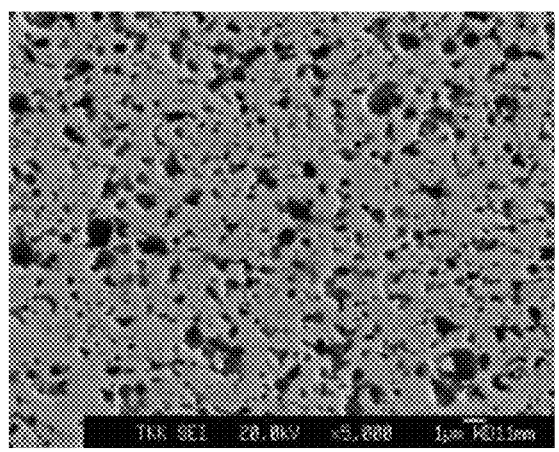
FIG. 20 is a SEM photograph of a sintered product in Reference Example 5 (an image taken at a magnification of 5,000×; a bar scale in the photograph represents 1 μm).
Figure 21:
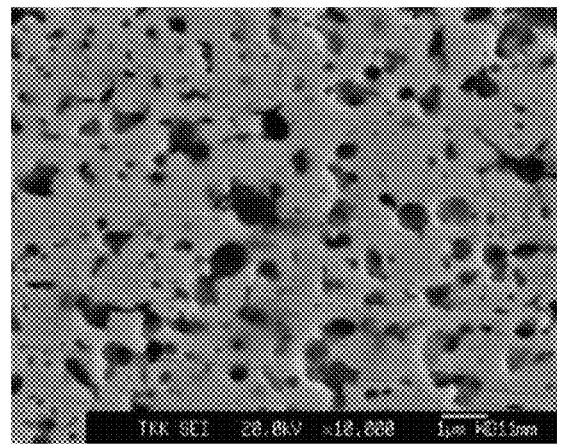
FIG. 21 is a SEM photograph of a sintered product in Reference Example 5 (an image taken at a magnification of 10,000×; a bar scale in the photograph represents 1 μm).

The structure of the sintered product made using the powder mixture taken at a cumulative number of ball mill revolutions of 3,741,120 was observed under a scanning electron microscope (SEM). FIGS. 18 to 21 show SEM photographs of the sintered products. FIG. 18 is a SEM photograph taken at a magnification of 1,000× (a bar scale in the photograph represents 10 μm). FIG. 19 is a SEM photograph taken at a magnification of 3,000× (a bar scale in the photograph represents 1 μm). FIG. 20 is a SEM photograph taken at a magnification of 5,000× (a bar scale in the photograph represents 1 μm). FIG. 21 is a SEM photograph taken at a magnification of 10,000× (a bar scale in the photograph represents 1 μm). In FIGS. 18 to 21, black portions correspond to the C phase and the $SiO_2$ phase, and white portions correspond to the FePt alloy phase. As can be seen from FIGS. 18 to 21, fine regions of the C phase and the $SiO_2$ phase are dispersed in the entire area of the structure.

The average size of the phase consisting of the C phase and the $SiO_2$ phase was determined by the intercept method based on the SEM photograph of FIG. 21 taken at a magnification of 10,000×. A specific method is the same as the method of Reference Example 1. As used herein, the phase consisting of the C phase and the $SiO_2$ phase refers to a phase picked out as the C phase and the $SiO_2$ phase, not distinguishing between the C phase and the $SiO_2$ phase and regarding them as a same phase.

The results showed that the average size of the phase consisting of the C phase and the $SiO_2$ phase determined by the intercept method was 0.28 μm.

Reference Example 6

The targeted composition of a powder mixture and a target in Reference Example 6 is (50Fe-50Pt)-9 vol % C-21 vol % $SiO_2$. That is, the targeted composition of metal components is 50 at % Fe-50 at % Pt; the targeted content of C is 9 vol % based on the total amount of the target; and the targeted content of metal oxide ($SiO_2$) is 21 vol % based on the total amount of the target. When the contents of C and metal oxide ($SiO_2$) are represented not by vol % but by mol %, the targeted composition of the powder mixture and the target in Reference Example 6 is (50Fe-50Pt)-15.24 mol % C-6.92 mol % $SiO_2$.

To 1100.00 g of 50 at % Fe-50 at % Pt alloy powder produced in the same manner as in Reference Example 1, 20.57 g of C powder having an average particle diameter of 35 μm and a bulk density of 0.25 g/cm³ was added so that the content of C is 8.8 vol % based on the total amount of the powders, and 47.73 g of $SiO_2$ powder having an average particle diameter of 0.7 μm and a bulk density of 2.20 g/cm³ was added so that the content of $SiO_2$ was 21.2 vol % based on the total amount of the powders. These components were then mixed with a ball mill until the cumulative number of revolutions reached 3,741,120 to produce a powder mixture.

During mixing, the mixing container was hermetically closed with a lid and filled with a gas mixture ($Ar+O_2$); and under the atmosphere in the mixing container, the 50 at % Fe-50 at % Pt alloy powder, the C powder, and the $SiO_2$ powder were mixed.

When the cumulative number of ball mill revolutions reached 935,280, 1,870,560, 2,805,840 and 3,741,120, the mixing container was opened, and whether or not ignition had occurred was visually checked. However, no ignition was found at each point.

When the cumulative number of ball mill revolution reached 3,741,120, 30.00 g of the powder mixture was subjected to hot pressing in a vacuum atmosphere at less than 20 Pa to produce a disc-like sintered product having a diameter of 30 mm. The hot-pressing conditions (sintering temperature, sintering pressure, and sintering time) and the relative density of the obtained sintered product are shown in TABLE 13 below. The theoretical density of the sintered product is 11.51 g/cm³, which is calculated in consideration of a reduction in the amount of carbon during mixing and sintering (i.e., calculated using the content of carbon in the sintered product shown in TABLE 14). Based on this theoretical density, the relative density of the sintered product was calculated.

TABLE 13

| Cumulative number of ball mill revolutions (Number) | Hot-pressing conditions | | | Relative density of sintered product (%) | Ignition |
|---|---|---|---|---|---|
| | Sintering temperature (° C.) | Sintering pressure (MPa) | Sintering time (min) | | |
| 935,280 | — | — | — | — | NO |
| 1,870,560 | — | — | — | — | NO |
| 2,805,840 | — | — | — | — | NO |
| 3,741,120 | 1280 | 24.5 | 45 | 97.50 | NO |

The relative density of the sintered product exceeds 97%, and the amount of voids in the obtained sintered product was small.

The contents of oxygen and nitrogen in the powder mixture taken at a cumulative number of ball mill revolutions of 3,741,120 were measured using a TC-600 Series Nitrogen/Oxygen Determinator manufactured by LECO Corporation, and the content of carbon was measured using a Carbon/Sulfur Analyzer manufactured by HORIBA, Ltd. The contents of oxygen and nitrogen in the sintered product made using the powder mixture taken at a cumulative number of ball mill revolutions of 3,741,120 were measured using a TC-600 Series Nitrogen/Oxygen Determinator manufactured by LECO Corporation, and the content of carbon was measured using a Carbon/Sulfur Analyzer manufactured by HORIBA, Ltd. The measurement results are shown in TABLE 14 below.

TABLE 14

| Cumulative number of ball mill revolutions of 3,741,120 | Oxygen (mass %) | Nitrogen (mass ppm) | Carbon (mass %) |
|---|---|---|---|
| Powder mixture | 3.50 | 164 | 2.31 |
| Sintered product | 1.95 | 5 | 1.76 |

The content of oxygen and the content of nitrogen in the sintered product both decrease compared to those in the powder mixture, while the degree of reduction in the content of oxygen is smaller than the degree of reduction in the content of nitrogen. This may be caused by the fact that the powder mixture and the sintered product both contain metal oxide $SiO_2$.

As comparing the content of oxygen and the content of nitrogen in the sintered product with those in the powder mixture, the degree of reduction in the content of oxygen and the content of nitrogen due to sintering in Reference Example 6 is larger than that in Reference Examples 1 and 2. This may be because the powder mixture of Reference Example 6 contains the C powder and thus oxygen and nitrogen have been adsorbed to the surface of the C powder.

Figure 22:
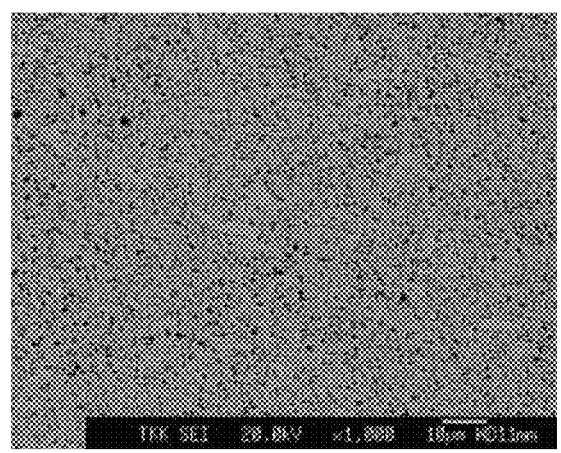
FIG. 22 is a SEM photograph of a sintered product in Reference Example 6 (an image taken at a magnification of 1,000×; a bar scale in the photograph represents 10 μm).
Figure 23:
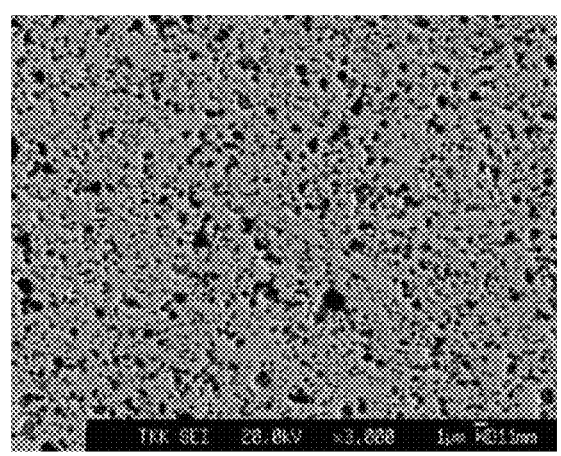
FIG. 23 is a SEM photograph of a sintered product in Reference Example 6 (an image taken at a magnification of 3,000×; a bar scale in the photograph represents 1 μm).
Figure 24:
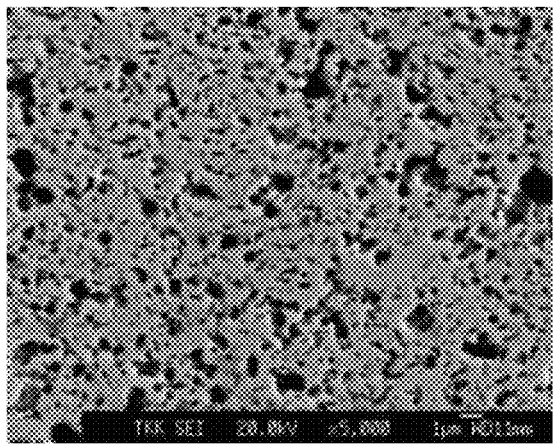
FIG. 24 is a SEM photograph of a sintered product in Reference Example 6 (an image taken at a magnification of 5,000×; a bar scale in the photograph represents 1 μm).
Figure 25:
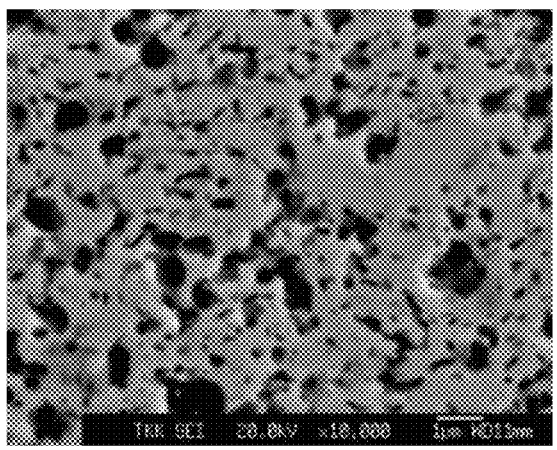
FIG. 25 is a SEM photograph of a sintered product in Reference Example 6 (an image taken at a magnification of 10,000×; a bar scale in the photograph represents 1 μm).

The structure of the sintered product made using the powder mixture taken at a cumulative number of ball mill revolutions of 3,741,120 was observed under a scanning electron microscope (SEM). FIGS. 22 to 25 show SEM photographs of the sintered products. FIG. 22 is a SEM photograph taken at a magnification of 1,000× (a bar scale in the photograph represents 10 μm). FIG. 23 is a SEM photograph taken at a magnification of 3,000× (a bar scale in the photograph represents 1 μm). FIG. 24 is a SEM photograph taken at a magnification of 5,000× (a bar scale in the photograph represents 1 μm). FIG. 25 is a SEM photograph taken at a magnification of 10,000× (a bar scale in the photograph represents 1 μm). In FIGS. 22 to 25, black portions correspond to the C phase and the $SiO_2$ phase, and white portions correspond to the FePt alloy phase. As can be seen from FIGS. 22 to 25, fine regions of the C phase and the $SiO_2$ phase are dispersed in the entire area of the structure.

The average size of the phase consisting of the C phase and the $SiO_2$ phase was determined by the intercept method based on the SEM photograph of FIG. 25 taken at a magnification of 10,000×. A specific method is the same as the method of Reference Example 1. As used herein, the phase consisting of the C phase and the $SiO_2$ phase refers to a phase picked out as the C phase and the $SiO_2$ phase, not distinguishing between the C phase and the $SiO_2$ phase and regarding them as a same phase.

The results showed that the average size of the phase consisting of the C phase and the $SiO_2$ phase determined by the intercept method was 0.23 μm.

Reference Example 7

The targeted composition of a powder mixture and a target in Reference Example 7 is (50Fe-50Pt)-12 vol % C-18 vol % $SiO_2$. That is, the targeted composition of metal components is 50 at % Fe-50 at % Pt; the targeted content of C is 12 vol % based on the total amount of the target; and the targeted content of metal oxide ($SiO_2$) is 18 vol % based on the total amount of the target. When the contents of C and metal oxide ($SiO_2$) are represented not by vol % but by mol %, the targeted composition of the powder mixture and the target in Reference Example 7 is (50Fe-50Pt)-19.53 mol % C-5.70 mol % $SiO_2$.

To 1100.00 g of 50 at % Fe-50 at % Pt alloy powder produced in the same manner as in Reference Example 1, 27.44 g of C powder having an average particle diameter of 35 μm and a bulk density of 0.25 g/cm³ was added so that the content of C is 12 vol % based on the total amount of the powders, and 40.07 g of $SiO_2$ powder having an average particle diameter of 0.7 μm and a bulk density of 2.20 g/cm³ was added so that the content of $SiO_2$ was 18 vol % based on the total amount of the powders. These components were then mixed with a ball mill until the cumulative number of revolutions reached 3,741,120 to produce a powder mixture.

During mixing, the mixing container was hermetically closed with a lid and filled with a gas mixture (Ar+$O_2$); and under the atmosphere in the mixing container, the 50 at % Fe-50 at % Pt alloy powder, the C powder, and the $SiO_2$ powder were mixed.

When the cumulative number of ball mill revolutions reached 935,280, 1,870,560, 2,805,840 and 3,741,120, the mixing container was opened, and whether or not ignition had occurred was visually checked. However, no ignition was found at each point.

When the cumulative number of ball mill revolution reached 3,741,120, 30.00 g of the powder mixture was subjected to hot pressing in a vacuum atmosphere at less than 20 Pa to produce a disc-like sintered product having a diameter of 30 mm. The hot-pressing conditions (sintering temperature, sintering pressure, and sintering time) and the relative density of the obtained sintered product are shown in TABLE 15 below. The theoretical density of the sintered product is 11.52 g/cm³, which is calculated in consideration of a reduction in the amount of carbon during mixing and sintering (i.e., calculated using the content of carbon in the sintered product shown in TABLE 16). Based on this theoretical density, the relative density of the sintered product was calculated.

TABLE 15

| Cumulative number of ball mill revolutions (Number) | Hot-pressing conditions | | | Relative density of sintered product (%) | Ignition |
|---|---|---|---|---|---|
| | Sintering temperature (° C.) | Sintering pressure (MPa) | Sintering time (min) | | |
| 935,280 | — | — | — | — | NO |
| 1,870,560 | — | — | — | — | NO |
| 2,805,840 | — | — | — | — | NO |
| 3,741,120 | 1300 | 24.5 | 45 | 96.68 | NO |

The relative density of the sintered product exceeds 96%, and the amount of voids in the obtained sintered product was small.

The contents of oxygen and nitrogen in the powder mixture taken at a cumulative number of ball mill revolutions of 3,741,120 were measured using a TC-600 Series Nitrogen/Oxygen Determinator manufactured by LECO Corporation, and the content of carbon was measured using a Carbon/Sulfur Analyzer manufactured by HORIBA, Ltd. The contents of oxygen and nitrogen in the sintered product made using the powder mixture taken at a cumulative number of ball mill revolutions of 3,741,120 were measured using a TC-600. Series Nitrogen/Oxygen Determinator manufactured by LECO Corporation, and the content of carbon was measured using a Carbon/Sulfur Analyzer manufactured by HORIBA, Ltd. The measurement results are shown in TABLE 16 below.

TABLE 16

| Cumulative number of ball mill revolutions of 3,741,120 | Oxygen (mass %) | Nitrogen (mass ppm) | Carbon (mass %) |
| --- | --- | --- | --- |
| Powder mixture | 3.26 | 209 | 3.12 |
| Sintered product | 1.79 | 10 | 2.47 |

The content of oxygen and the content of nitrogen in the sintered product both decrease compared to those in the powder mixture, while the degree of reduction in the content of oxygen is smaller than the degree of reduction in the content of nitrogen. This may be caused by the fact that the powder mixture and the sintered product both contain metal oxide $SiO_2$.

As comparing the content of oxygen and the content of nitrogen in the sintered product with those in the powder mixture, the degree of reduction in the content of oxygen and the content of nitrogen due to sintering in Reference Example 7 is larger than that in Reference Examples 1 and 2. This may be because the powder mixture of Reference Example 7 contains the C powder and thus oxygen and nitrogen have been adsorbed to the surface of the C powder.

Figure 26:
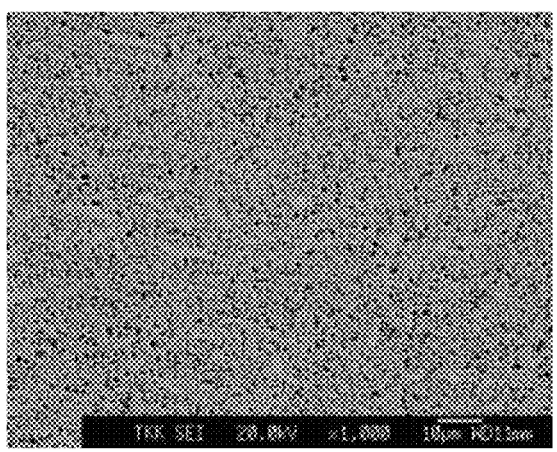
FIG. 26 is a SEM photograph of a sintered product in Reference Example 7 (an image taken at a magnification of 1,000×; a bar scale in the photograph represents 10 μm).
Figure 27:
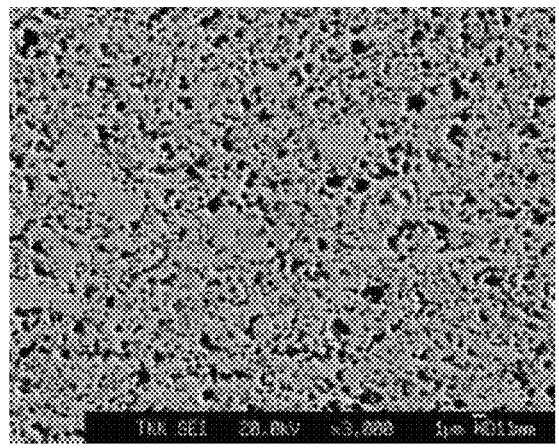
FIG. 27 is a SEM photograph of a sintered product in Reference Example 7 (an image taken at a magnification of 3,000×; a bar scale in the photograph represents 1 μm).
Figure 28:
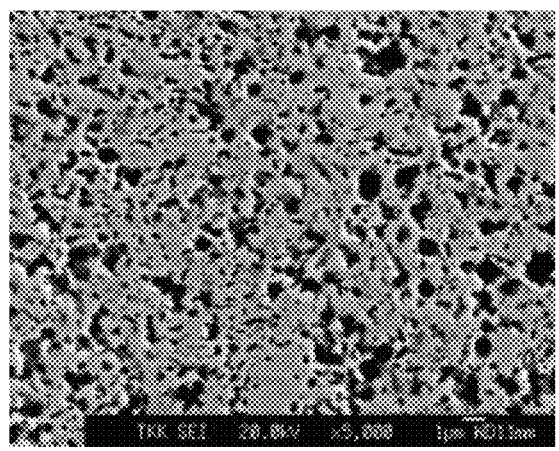
FIG. 28 is a SEM photograph of a sintered product in Reference Example 7 (an image taken at a magnification of 5,000×; a bar scale in the photograph represents 1 μm).
Figure 29:
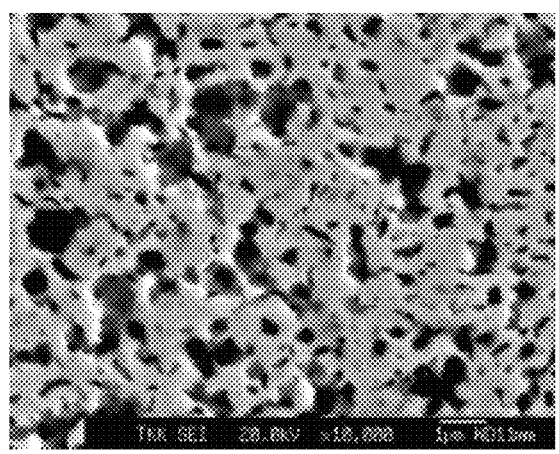
FIG. 29 is a SEM photograph of a sintered product in Reference Example 7 (an image taken at a magnification of 10,000×; a bar scale in the photograph represents 1 μm).

The structure of the sintered product made using the powder mixture taken at a cumulative number of ball mill revolutions of 3,741,120 was observed under a scanning electron microscope (SEM). FIGS. 26 to 29 show SEM photographs of the sintered products. FIG. 26 is a SEM photograph taken at a magnification of 1,000× (a bar scale in the photograph represents 10 μm). FIG. 27 is a SEM photograph taken at a magnification of 3,000× (a bar scale in the photograph represents 1 μm). FIG. 28 is a SEM photograph taken at a magnification of 5,000× (a bar scale in the photograph represents 1 μm). FIG. 29 is a SEM photograph taken at a magnification of 10,000× (a bar scale in the photograph represents 1 μm). In FIGS. 26 to 29, black portions correspond to the C phase and the $SiO_2$ phase, and white portions correspond to the FePt alloy phase. As can be seen from FIGS. 26 to 29, fine regions of the C phase and the $SiO_2$ phase are dispersed in the entire area of the structure.

The average size of the phase consisting of the C phase and the $SiO_2$ phase was determined by the intercept method based on the SEM photograph of FIG. 29 taken at a magnification of 10,000×. A specific method is the same as the method of Reference Example 1. As used herein, the phase consisting of the C phase and the $SiO_2$ phase refers to a phase picked out as the C phase and the $SiO_2$ phase, not distinguishing between the C phase and the $SiO_2$ phase and regarding them as a same phase.

The results showed that the average size of the phase consisting of the C phase and the $SiO_2$ phase determined by the intercept method was 0.30 μm.

Reference Example 8

The targeted composition of a powder mixture and a target in Reference Example 8 is (50Fe-50Pt)-15 vol % C-15 vol % $SiO_2$. That is, the targeted composition of metal components is 50 at % Fe-50 at % Pt; the targeted content of C is 15 vol % based on the total amount of the target; and the targeted content of metal oxide ($SiO_2$) is 15 vol % based on the total amount of the target. When the contents of C and metal oxide ($SiO_2$) are represented not by vol % but by mol %, the targeted composition of the powder mixture and the target in Reference Example 8 is (50Fe-50Pt)-23.48 mol % C-4.57 mol % $SiO_2$.

To 1100.00 g of 50 at % Fe-50 at % Pt alloy powder produced in the same manner as in Reference Example 1, 34.37 g of C powder having an average particle diameter of 35 μm and a bulk density of 0.25 g/cm³ was added so that the content of C is 15 vol % based on the total amount of the powders, and 33.46 g of $SiO_2$ powder having an average particle diameter of 0.7 μm and a bulk density of 2.20 g/cm³ was added so that the content of $SiO_2$ was 15 vol % based on the total amount of the powders. These components were then mixed with a ball mill until the cumulative number of revolutions reached 3,741,120 to produce a powder mixture.

During mixing, the mixing container was hermetically closed with a lid and filled with a gas mixture (Ar+$O_2$); and under the atmosphere in the mixing container, the 50 at % Fe-50 at % Pt alloy powder, the C powder, and the $SiO_2$ powder were mixed.

When the cumulative number of ball mill revolutions reached 935,280, 1,870,560, 2,805,840 and 3,741,120, the mixing container was opened, and whether or not ignition had occurred was visually checked. However, no ignition was found at each point.

When the cumulative number of ball mill revolution reached 1,870,560, 2,805,840 and 3,741,120, 30.00 g of the powder mixture was subjected to hot pressing in a vacuum atmosphere at less than 20 Pa to produce a disc-like sintered product having a diameter of 30 mm. The hot-pressing conditions (sintering temperature, sintering pressure, and sintering time) and the relative density of the obtained sintered product are shown in TABLE 17 below. The theoretical density of the sintered product is 11.51 g/cm³, which is calculated in consideration of a reduction in the amount of carbon during mixing and sintering (i.e., calculated using the content of carbon in the sintered product shown in TABLE 18). Based on this theoretical density, the relative density of the sintered product (sintered product made using the powder mixture taken at a cumulative number of ball mill revolutions of 3,741,120) was calculated.

TABLE 17

| Cumulative number of ball mill revolutions (Number) | Hot-pressing conditions | | | Relative density of sintered product (%) | Ignition |
| --- | --- | --- | --- | --- | --- |
| | Sintering temperature (° C.) | Sintering pressure (MPa) | Sintering time (min) | | |
| 935,280 | — | — | — | — | NO |
| 1,870,560 | 1370 | 26.2 | 45 | — | NO |
| 2,805,840 | 1300 | 26.2 | 45 | — | NO |
| 3,741,120 | 1290 | 26.2 | 45 | 95.81 | NO |

The relative density of the sintered product exceeds 95%, and the amount of voids in the obtained sintered product was small.

The contents of oxygen and nitrogen in the powder mixture taken at a cumulative number of ball mill revolutions of 3,741,120 were measured using a TC-600 Series Nitrogen/Oxygen Determinator manufactured by LECO Corporation, and the content of carbon was measured using a Carbon/Sulfur Analyzer manufactured by HORIBA, Ltd. The contents of oxygen and nitrogen in the sintered product made using the powder mixture taken at a cumulative number of ball mill revolutions of 3,741,120 were measured using a TC-600. Series Nitrogen/Oxygen Determinator manufactured by LECO Corporation, and the content of carbon was measured using a Carbon/Sulfur Analyzer manufactured by HORIBA, Ltd. The measurement results are shown in TABLE 18 below.

TABLE 18

| Cumulative number of ball mill revolutions of 3,741,120 | Oxygen (mass %) | Nitrogen (mass ppm) | Carbon (mass %) |
|---|---|---|---|
| Powder mixture | 3.22 | 186 | 2.87 |
| Sintered product | 1.39 | 6 | 2.24 |

The content of oxygen and the content of nitrogen in the sintered product both decrease compared to those in the powder mixture, while the degree of reduction in the content of oxygen is smaller than the degree of reduction in the content of nitrogen. This may be caused by the fact that the powder mixture and the sintered product both contain metal oxide $SiO_2$.

As comparing the content of oxygen and the content of nitrogen in the sintered product with those in the powder mixture, the degree of reduction in the content of oxygen and the content of nitrogen due to sintering in Reference Example 8 is larger than that in Reference Examples 1 and 2. This may be because the powder mixture of Reference Example 8 contains the C powder and thus oxygen and nitrogen have been adsorbed to the surface of the C powder.

Figure 30:
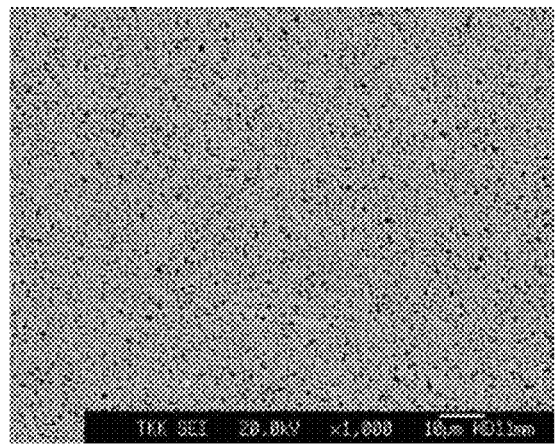
FIG. 30 is a SEM photograph of a sintered product in Reference Example 8 (an image taken at a magnification of 1,000×; a bar scale in the photograph represents 10 μm).
Figure 31:
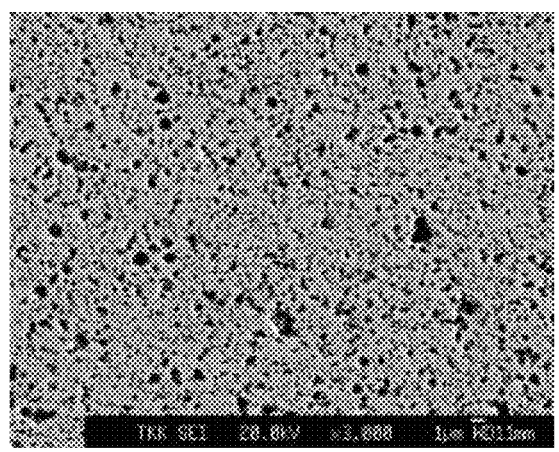
FIG. 31 is a SEM photograph of a sintered product in Reference Example 8 (an image taken at a magnification of 3,000×; a bar scale in the photograph represents 1 μm).
Figure 32:
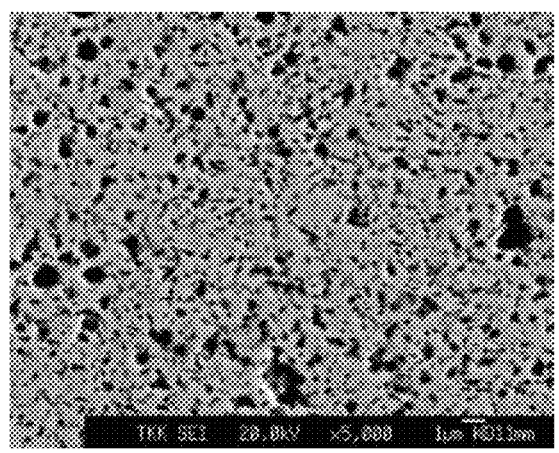
FIG. 32 is a SEM photograph of a sintered product in Reference Example 8 (an image taken at a magnification of 5,000×; a bar scale in the photograph represents 1 μm).
Figure 33:
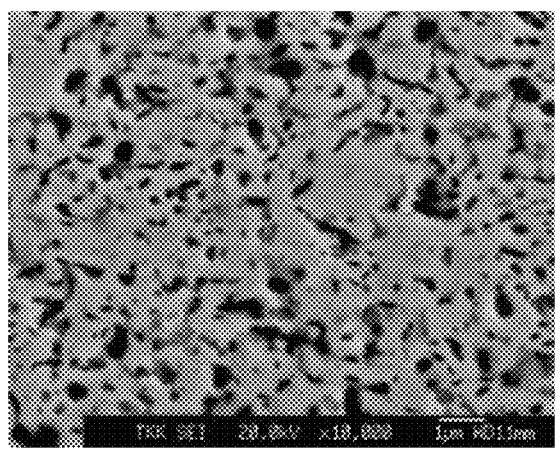
FIG. 33 is a SEM photograph of a sintered product in Reference Example 8 (an image taken at a magnification of 10,000×; a bar scale in the photograph represents 1 μm).

The structure of the sintered product made using the powder mixture taken at a cumulative number of ball mill revolutions of 3,741,120 was observed under a scanning electron microscope (SEM). FIGS. 30 to 33 show SEM photographs of the sintered products. FIG. 30 is a SEM photograph taken at a magnification of 1,000× (a bar scale in the photograph represents 10 μm). FIG. 31 is a SEM photograph taken at a magnification of 3,000× (a bar scale in the photograph represents 1 μm). FIG. 32 is a SEM photograph taken at a magnification of 5,000× (a bar scale in the photograph represents 1 μm). FIG. 33 is a SEM photograph taken at a magnification of 10,000× (a bar scale in the photograph represents 1 μm). In FIGS. 30 to 33, black portions correspond to the C phase and the $SiO_2$ phase, and white portions correspond to the FePt alloy phase. As can be seen from FIGS. 30 to 33, fine regions of the C phase and the $SiO_2$ phase are dispersed in the entire area of the structure.

The average size of the phase consisting of the C phase and the $SiO_2$ phase was determined by the intercept method based on the SEM photograph of FIG. 33 taken at a magnification of 10,000×. A specific method is the same as the method of Reference Example 1. As used herein, the phase consisting of the C phase and the $SiO_2$ phase refers to a phase picked out as the C phase and the $SiO_2$ phase, not distinguishing between the C phase and the $SiO_2$ phase and regarding them as a same phase.

The results showed that the average size of the phase consisting of the C phase and the $SiO_2$ phase determined by the intercept method was 0.20 μm.

Reference Example 9

The targeted composition of a powder mixture and a target in Reference Example 9 is (50Fe-50Pt)-15 vol % C-15 vol % $TiO_2$. That is, the targeted composition of metal components is 50 at % Fe-50 at % Pt; the targeted content of C is 15 vol % based on the total amount of the target; and the targeted content of metal oxide ($TiO_2$) is 15 vol % based on the total amount of the target. When the contents of C and metal oxide ($TiO_2$) are represented not by vol % but by mol %, the targeted composition of the powder mixture and the target in Reference Example 9 is (50Fe-50Pt)-23.04 mol % C-6.39 mol % $TiO_2$.

To 1100.00 g of 50 at % Fe-50 at % Pt alloy powder produced in the same manner as in Reference Example 1, 34.38 g of C powder having an average particle diameter of 35 μm and a bulk density of 0.25 g/cm³ was added so that the content of C is 15 vol % based on the total amount of the powders, and 63.41 g of $TiO_2$ powder having an average particle diameter of 0.07 μm and a bulk density of 4.11 g/cm³ was added so that the content of $TiO_2$ was 15 vol % based on the total amount of the powders. These components were then mixed with a ball mill until the cumulative number of revolutions reached 3,741,120 to produce a powder mixture.

During mixing, the mixing container was hermetically closed with a lid and filled with a gas mixture ($Ar+O_2$); and under the atmosphere in the mixing container, the 50 at % Fe-50 at % Pt alloy powder, the C powder, and the $TiO_2$ powder were mixed.

When the cumulative number of ball mill revolutions reached 935,280, 1,870,560, 2,805,840 and 3,741,120, the mixing container was opened, and whether or not ignition had occurred was visually checked. However, no ignition was found at each point.

When the cumulative number of ball mill revolution reached 1,870,560, 2,805,840 and 3,741,120, 30.00 g of the powder mixture was subjected to hot pressing in a vacuum atmosphere at less than 20 Pa to produce a disc-like sintered product having a diameter of 30 mm. The hot-pressing conditions (sintering temperature, sintering pressure, and sintering time) and the relative density of the obtained sintered product are shown in TABLE 19 below. The theoretical density of the sintered product is 12.45 g/cm³, which is calculated in consideration of a reduction in the amount of carbon during mixing and sintering (i.e., calculated using the content of carbon in the sintered product shown in TABLE 20). Based on this theoretical density, the relative density of the sintered product (sintered product made using the powder mixture taken at a cumulative number of ball mill revolutions of 3,741,120) was calculated.

TABLE 19

| Cumulative number of ball mill revolutions (Number) | Hot-pressing conditions | | | Relative density of sintered product (%) | Ignition |
|---|---|---|---|---|---|
| | Sintering temperature (° C.) | Sintering pressure (MPa) | Sintering time (min) | | |
| 935,280 | — | — | — | — | NO |
| 1,870,560 | 1350 | 26.2 | 45 | — | NO |
| 2,805,840 | 1290 | 26.2 | 45 | — | NO |
| 3,741,120 | 1280 | 26.2 | 45 | 95.00 | NO |

The relative density of the sintered product is 95%, and the amount of voids in the obtained sintered product was small.

The contents of oxygen and nitrogen in the powder mixture taken at a cumulative number of ball mill revolutions of 3,741,120 were measured using a TC-600 Series Nitrogen/Oxygen Determinator manufactured by LECO Corporation, and the content of carbon was measured using a Carbon/Sulfur Analyzer manufactured by HORIBA, Ltd. The contents of oxygen and nitrogen in the sintered product made using the powder mixture taken at a cumulative number of ball mill revolutions of 3,741,120 were measured using a TC-600. Series Nitrogen/Oxygen Determinator manufactured by LECO Corporation, and the content of carbon was measured using a Carbon/Sulfur Analyzer manufactured by HORIBA, Ltd. The measurement results are shown in TABLE 20 below.

TABLE 20

| Cumulative number of ball mill revolutions of 3,741,120 | Oxygen (mass %) | Nitrogen (mass ppm) | Carbon (mass %) |
|---|---|---|---|
| Powder mixture | 4.55 | 117 | 2.72 |
| Sintered product | 1.88 | 5 | 1.86 |

The content of oxygen and the content of nitrogen in the sintered product both decrease compared to those in the powder mixture, while the degree of reduction in the content of oxygen is smaller than the degree of reduction in the content of nitrogen. This may be caused by the fact that the powder mixture and the sintered product both contain metal oxide $TiO_2$.

As comparing the content of oxygen and the content of nitrogen in the sintered product with those in the powder mixture, the degree of reduction in the content of oxygen and the content of nitrogen due to sintering in Reference Example 9 is larger than that in Reference Examples 1 and 2. This may be because the powder mixture of Reference Example 9 contains the C powder and thus oxygen and nitrogen have been adsorbed to the surface of the C powder.

Figure 34:
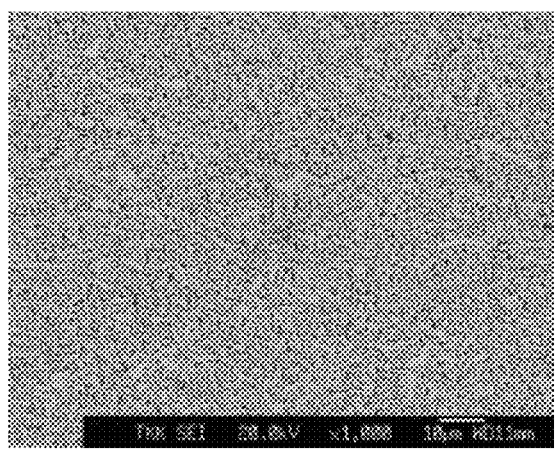
FIG. 34 is a SEM photograph of a sintered product in Reference Example 9 (an image taken at a magnification of 1,000×; a bar scale in the photograph represents 10 μm).
Figure 35:
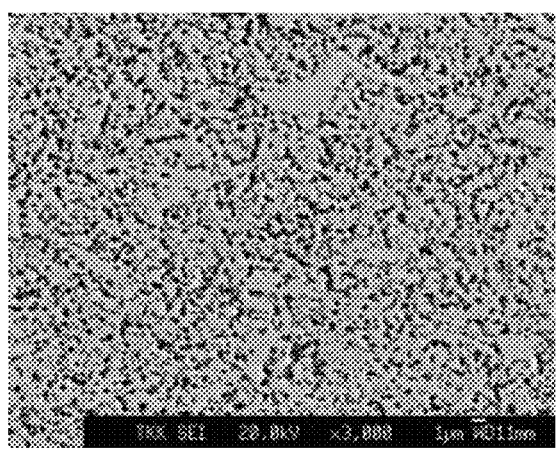
FIG. 35 is a SEM photograph of a sintered product in Reference Example 9 (an image taken at a magnification of 3,000×; a bar scale in the photograph represents 1 μm).
Figure 36:
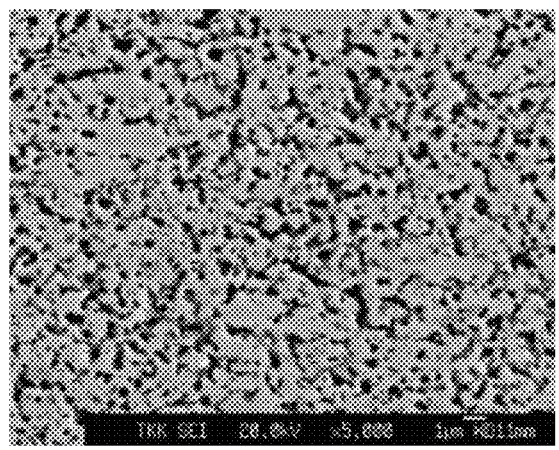
FIG. 36 is a SEM photograph of a sintered product in Reference Example 9 (an image taken at a magnification of 5,000×; a bar scale in the photograph represents 1 μm).
Figure 37:
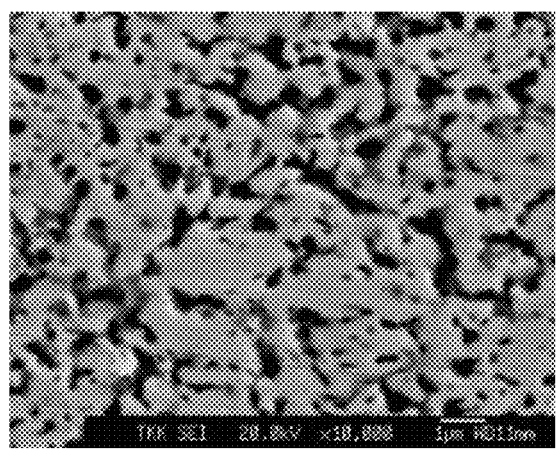
FIG. 37 is a SEM photograph of a sintered product in Reference Example 9 (an image taken at a magnification of 10,000×; a bar scale in the photograph represents 1 μm).

The structure of the sintered product made using the powder mixture taken at a cumulative number of ball mill revolutions of 3,741,120 was observed under a scanning electron microscope (SEM). FIGS. 34 to 37 show SEM photographs of the sintered products. FIG. 34 is a SEM photograph taken at a magnification of 1,000× (a bar scale in the photograph represents 10 μm). FIG. 35 is a SEM photograph taken at a magnification of 3,000× (a bar scale in the photograph represents 1 μm). FIG. 36 is a SEM photograph taken at a magnification of 5,000× (a bar scale in the photograph represents 1 μm). FIG. 37 is a SEM photograph taken at a magnification of 10,000× (a bar scale in the photograph represents 1 μm). In FIGS. 34 to 37, black portions correspond to the C phase and the $TiO_2$ phase, and white portions correspond to the FePt alloy phase. As can be seen from FIGS. 34 to 37, fine regions of the C phase and the $TiO_2$ phase are dispersed in the entire area of the structure.

The average size of the phase consisting of the C phase and the $SiO_2$ phase was determined by the intercept method based on the SEM photograph of FIG. 37 taken at a magnification of 10,000×. A specific method is the same as the method of Reference Example 1. As used herein, the phase consisting of the C phase and the $TiO_2$ phase refers to a phase picked out as the C phase and the $TiO_2$ phase, not distinguishing between the C phase and the $TiO_2$ phase and regarding them as a same phase.

The results showed that the average size of the phase consisting of the C phase and the $TiO_2$ phase determined by the intercept method was 0.29 μm.

Example 1

The targeted composition of a powder mixture and a target in Example 1 is (50Fe-45Pt-5Cu)-20.3 vol % $B_2O_3$. That is, the targeted composition of metal components is 50 at % Fe-45 at % Pt-5 at % Cu; and the targeted content of metal oxide ($B_2O_3$) is 20.3 vol % based on the total amount of the target. When the content of metal oxide ($B_2O_3$) is represented not by vol % but by mol %, the targeted composition of the powder mixture and the target in Example 1 is (50Fe-45Pt-5Cu)-5.11 mol % $B_2O_3$.

The metals in bulk form were weighed such that the composition of the alloy was Fe: 50 at %, Pt: 45 at %, and Pt: 5 at % and then heated by high frequency heating to form a molten Fe—Pt—Cu alloy at 1,800° C. Then a gas atomizing method using argon gas was performed to produce 50 at % Fe-45 at % Pt-5 at % Cu alloy powder. The average particle diameter of the obtained alloy powder was measured using Microtrac MT3000 manufactured by NIKKISO Co., Ltd. and found to be 50 μm.

To 1030.00 g of the obtained 50 at % Fe-45 at % Pt-5 at % Cu alloy powder, 32.49 g of $B_2O_3$ powder was added so that the content of $B_2O_3$ is 20.3 vol % based on the total amount of the powders. These components were then mixed with a ball mill until the cumulative number of revolutions reached 3,852,360 to produce a powder mixture.

During mixing, the mixing container was hermetically closed with a lid and filled with a gas mixture ($Ar+O_2$); and under the atmosphere in the mixing container, the 50 at % Fe-45 at % Pt-5 at % Cu alloy powder and the $B_2O_3$ powder were mixed.

When the cumulative number of ball mill revolutions reached 1,046,520, 1,981,800, 2,917,080 and 3,852,360, the mixing container was opened, and whether or not ignition had occurred was visually checked. However, no ignition was found at each point.

When the cumulative number of ball mill revolution reached 3,852,360, 30.00 g of the powder mixture was subjected to hot pressing in a vacuum atmosphere at less than 20 Pa to produce a disc-like sintered product having a diameter of 30 mm. The hot-pressing conditions (sintering temperature, sintering pressure, and sintering time) and the relative density of the obtained sintered product are shown in TABLE 21 below. As shown below in TABLE 23, the content of B increased only by 0.04% by mass compared to the state of the powder mixture before sintering in the ICP analysis results. Since there was no step involving direct incorporation of $B_2O_3$ in a series of steps including ICP analysis, the theoretical density of the sintered product was calculated without consideration of an increase in the content of B and found to be 12.22 g/cm³. The relative density of the sintered product (sintered product made using the powder mixture taken at a cumulative number of ball mill revolutions of 3,852,360) was calculated based on the theoretical density of 12.22 g/cm³ and found to be 100.09%.

TABLE 21

| Cumulative number of ball mill revolutions (Number) | Hot-pressing conditions | | | Relative density of sintered product (%) | Ignition |
|---|---|---|---|---|---|
| | Sintering temperature (° C.) | Sintering pressure (MPa) | Sintering time (min) | | |
| 1,046,520 | — | — | — | — | NO |
| 1,981,800 | — | — | — | — | NO |
| 2,917,080 | — | — | — | — | NO |
| 3,852,360 | 770 | 26.2 | 45 | 100.09 | NO |

The relative density of the sintered product exceeds 100%, and the amount of voids in the obtained sintered product was small.

The contents of oxygen and nitrogen in the sintered product made using the powder mixture taken at a cumulative number of ball mill revolutions of 3,852,360 were measured using a TC-600 Series Nitrogen/Oxygen Determinator manufactured by LECO Corporation. The measurement results are shown in TABLE 22 below.

TABLE 22

| Cumulative number of ball mill revolutions of 3,852,360 | Oxygen (mass %) | Nitrogen (mass ppm) |
|---|---|---|
| Sintered product | 2.70 | 58 |

The contents of Fe, Pt, Cu, and B in the sintered product made of the powder mixture taken at a cumulative number of ball mill revolutions of 3,852,360 were analyzed by ICP. TABLE 25 below shows the analysis results as well as the contents of Fe, Pt, Cu, and B in the powder mixture before sintering. The contents of Fe, Pt, Cu, and B in the powder mixture before sintering are not the analysis results by ICP but the calculated values (theoretical values) based on the amounts of raw material powders blended for producing the powder mixture.

TABLE 23

| Cumulative number of ball mill revolutions of 3,852,360 | Fe (mass %) | Pt (mass %) | Cu (mass %) | B (mass %) |
|---|---|---|---|---|
| Powder mixture | 22.77 | 71.58 | 2.59 | 0.95 |
| Sintered product | 22.95 | 72.73 | 2.38 | 0.99 |

Figure 38:
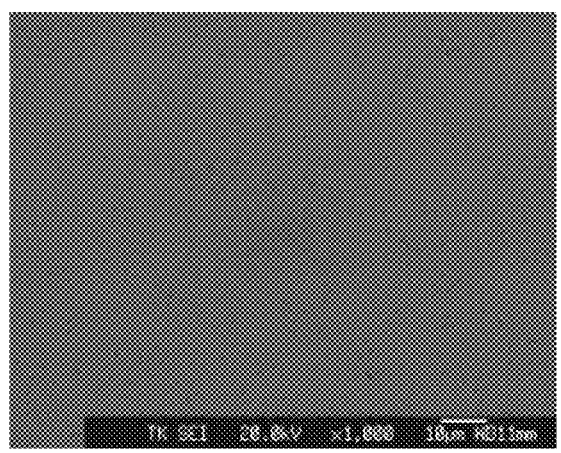
FIG. 38 is a SEM photograph of a sintered product in Example 1 (an image taken at a magnification of 1,000×; a bar scale in the photograph represents 10 μm).
Figure 39:
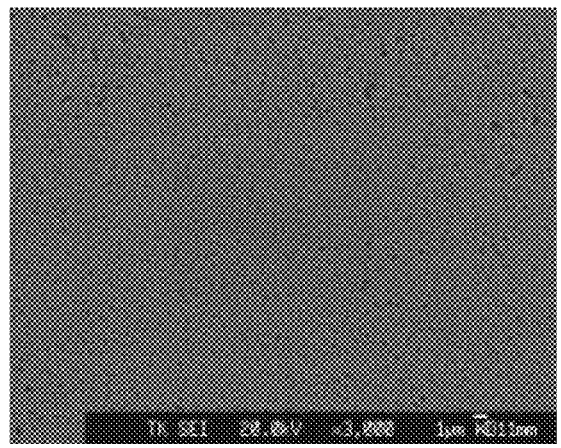
FIG. 39 is a SEM photograph of a sintered product in Example 1 (an image taken at a magnification of 3,000×; a bar scale in the photograph represents 1 μm).
Figure 40:
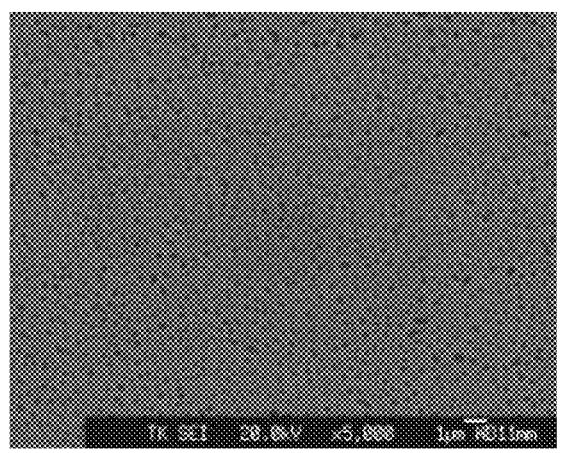
FIG. 40 is a SEM photograph of a sintered product in Example 1 (an image taken at a magnification of 5,000×; a bar scale in the photograph represents 1 μm).
Figure 41:
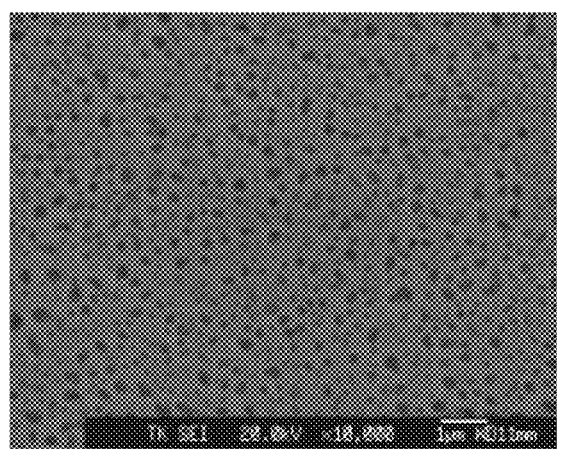
FIG. 41 is a SEM photograph of a sintered product in Example 1 (an image taken at a magnification of 10,000×; a bar scale in the photograph represents 1 μm).

The structure of the sintered product made using the powder mixture taken at a cumulative number of ball mill revolutions of 3,852,360 was observed under a scanning electron microscope (SEM). FIGS. 38 to 41 show SEM photographs of the sintered products. FIG. 38 is a SEM photograph taken at a magnification of 1,000× (a bar scale in the photograph represents 10 μm). FIG. 39 is a SEM photograph taken at a magnification of 3,000× (a bar scale in the photograph represents 1 μm). FIG. 40 is a SEM photograph taken at a magnification of 5,000× (a bar scale in the photograph represents 1 μm). FIG. 41 is a SEM photograph taken at a magnification of 10,000× (a bar scale in the photograph represents 1 μm). In FIGS. 38 to 41, black portions correspond to the $B_2O_3$ phase, and white portions correspond to the FePtCu alloy phase. As can be seen from FIGS. 38 to 41, fine regions of the $B_2O_3$ phase are dispersed in the entire area of the structure.

The average size of the $B_2O_3$ phase was determined by the intercept method based on the SEM photograph of FIG. 41 taken at a magnification of 10,000×. A specific method is the same as the method of Reference Example 1.

The results showed that the average size of the $B_2O_3$ phase determined by the intercept method was 0.14 μm.

Example 2

The targeted composition of a powder mixture and a target in Example 2 is (45Fe-45Pt-10Cu)-15 vol % C-15 vol % $SiO_2$. That is, the targeted composition of metal components is 45 at % Fe-45 at % Pt-10 at % Cu; the targeted content of C is 15 vol % based on the total amount of the target; and the targeted content of metal oxide ($SiO_2$) is 15 vol % based on the total amount of the target. When the contents of C and metal oxide ($SiO_2$) are represented not by vol % but by mol %, the targeted composition of the powder mixture and the target in Example 2 is (45Fe-45Pt-10Cu)-24 mol % C-5 mol % $SiO_2$.

The metals in bulk form were weighed such that the composition of the alloy was Fe: 45 at %, Pt: 45 at %, and Cu: 10 at % and then heated by high frequency heating to form a molten Fe—Pt—Cu alloy at 1,800° C. Then a gas atomizing method using argon gas was performed to produce 45 at % Fe-45 at % Pt-10 at % Cu alloy powder. The average particle diameter of the obtained alloy powder was measured using Microtrac MT3000 manufactured by NIKKISO Co., Ltd. and found to be 50 μm.

To 1020.00 g of the obtained 45 at % Fe-45 at % Pt-10 at % Cu alloy powder, 44.63 g of C powder having an average particle diameter of 35 μm and a bulk density of 0.25 g/cm³ was added so that the content of C is 15 vol % based on the total amount of the powders, and 32.56 g of $SiO_2$ powder having an average particle diameter of 0.7 μm and a bulk density of 2.20 g/cm³ was added so that the content of $SiO_2$ was 15 vol % based on the total amount of the powders. These components were then mixed with a ball mill until the cumulative number of revolutions reached 5,736,960 to produce a powder mixture.

During mixing, the mixing container was hermetically closed with a lid and filled with a gas mixture (Ar+$O_2$); and under the atmosphere in the mixing container, the 45 at % Fe-45 at % Pt-10 at % Cu alloy powder, the C powder, and the $SiO_2$ powder were mixed.

When the cumulative number of ball mill revolutions reached 935,280, 2,535,840, 4,136,400 and 5,736,960, the mixing container was opened, and whether or not ignition had occurred was visually checked. However, no ignition was found at each point.

When the cumulative number of ball mill revolution reached 5,736,960, 30.00 g of the powder mixture was subjected to hot pressing in a vacuum atmosphere at less than 20 Pa to produce a disc-like sintered product having a diameter of 30 mm. The hot-pressing conditions (sintering temperature, sintering pressure, and sintering time) and the relative density of the obtained sintered product are shown in TABLE 24 below. The theoretical density of the sintered product is 11.11 g/cm³, which is calculated in consideration of a reduction in the amount of carbon during mixing and sintering (i.e., calculated using the content of carbon in the sintered product shown in TABLE 25). Based on this theoretical density, the relative density of the sintered product (sintered product made using the powder mixture taken at a cumulative number of ball mill revolutions of 5,736,960) was calculated.

TABLE 24

| Cumulative number of ball mill revolutions (Number) | Hot-pressing conditions | | | Relative density of sintered product (%) | Ignition |
|---|---|---|---|---|---|
| | Sintering temperature (° C.) | Sintering pressure (MPa) | Sintering time (min) | | |
| 935,280 | — | — | — | — | NO |
| 2,535,840 | — | — | — | — | NO |
| 4,136,400 | — | — | — | — | NO |
| 5,736,960 | 1420 | 24.5 | 45 | 93.36 | NO |

The relative density of the sintered product exceeds 93%, and the amount of voids in the obtained sintered product was small.

The contents of oxygen and nitrogen in the sintered product made using the powder mixture taken at a cumulative number of ball mill revolutions of 5,736,960 were measured using a TC-600 Series Nitrogen/Oxygen Determinator manufactured by LECO Corporation, and the content of carbon was measured using a Carbon/Sulfur Analyzer manufactured by HORIBA, Ltd. The measurement results are shown in TABLE 25 below.

TABLE 25

| Cumulative number of ball mill revolutions of 5,736,960 | Oxygen (mass %) | Nitrogen (mass ppm) | Carbon (mass %) |
|---|---|---|---|
| Sintered product | 1.46 | 23 | 3.30 |

Figure 42:
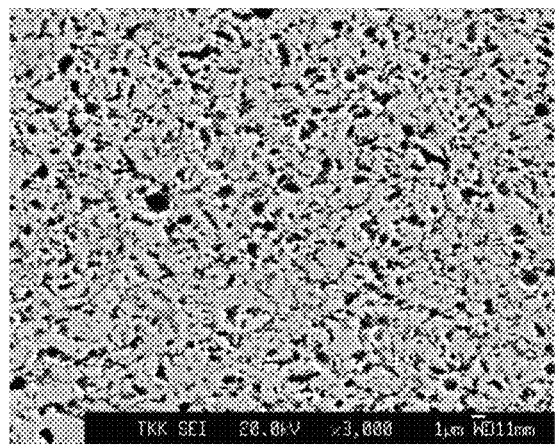
FIG. 42 is a SEM photograph of a sintered product in Example 2 (an image taken at a magnification of 3,000×; a bar scale in the photograph represents 1 μm).
Figure 43:
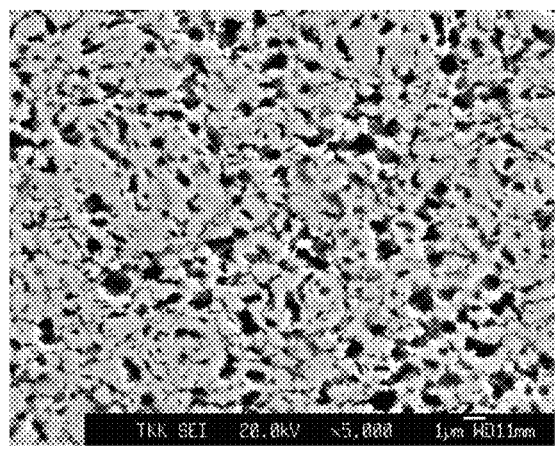
FIG. 43 is a SEM photograph of a sintered product in Example 2 (an image taken at a magnification of 5,000×; a bar scale in the photograph represents 1 μm).
Figure 44:
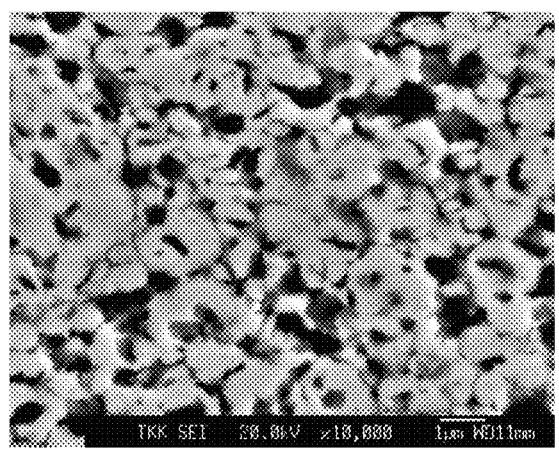
FIG. 44 is a SEM photograph of a sintered product in Example 2 (an image taken at a magnification of 10,000×; a bar scale in the photograph represents 1 μm).

The structure of the sintered product made using the powder mixture taken at a cumulative number of ball mill revolutions of 5,736,960 was observed under a scanning electron microscope (SEM). FIGS. 42 to 44 show SEM photographs of the sintered products. FIG. 42 is a SEM photograph taken at a magnification of 3,000× (a bar scale in the photograph represents 1 μm). FIG. 43 is a SEM photograph taken at a magnification of 5,000× (a bar scale in the photograph represents 1 μm). FIG. 44 is a SEM photograph taken at a magnification of 10,000× (a bar scale in the photograph represents 1 μm). In FIGS. 42 to 44, black portions correspond to the C phase and the $TiO_2$ phase, and white portions correspond to the FePtCu alloy phase. As can be seen from FIGS. 42 to 44, fine regions of the C phase and the $SiO_2$ phase are dispersed in the entire area of the structure.

The average size of the phase consisting of the C phase and the $SiO_2$ phase was determined by the intercept method based on the SEM photograph of FIG. 44 taken at a magnification of 10,000×. A specific method is the same as the method of Reference Example 1. As used herein, the phase consisting of the C phase and the $SiO_2$ phase refers to a phase picked out as the C phase and the $SiO_2$ phase, not distinguishing between the C phase and the $SiO_2$ phase and regarding them as a same phase.

The results showed that the average size of the phase consisting of the C phase and the $SiO_2$ phase determined by the intercept method was 0.27 μm.

Comparative Example 1

The targeted composition of a powder mixture and a target in Comparative example 1 is (50Fe-50Pt)-30 vol % C. More specifically, the targeted composition of the metal components is 50 at % Fe-50 at % Pt, and the targeted content of C is 30 vol % based on the total amount of the target. When the content of C is represented not by vol % but by at %, the targeted composition of the powder mixture and the target in Comparative example 1 is (50Fe-50Pt)-40 at % C.

A powder mixture and a sintered product were produced in the same manner as in Reference Example 1 except that C powder was used instead of $SiO_2$ powder, that a mixing container was filled with argon (Ar) and hermetically sealed, and FePt powder and C powder were mixed in the sealed mixing container, that the cumulative number of ball mill revolutions was changed, that the number of times and the timing of introduction of fresh air by opening the mixing container during mixing were changed, and that the sintering temperature during the production of the sintered product was changed to 1,100° C.

When the cumulative number of ball mill revolutions reached 209,520, 608,040, 1,006,560, 1,405,080, 1,803,600, 2,202,120, and 2,816,640, the mixing container was opened, and whether or not ignition had occurred was visually checked. Until the point of time when the cumulative number of ball mill revolutions was 2,202,120, no ignition was found. However, at the point of time when the cumulative number of ball mill revolutions was 2,816,640, ignition was found.

To be precise, the atmosphere in the mixing container during mixing was the sealed gas mixture (Ar—$O_2$) atmosphere only in the initial stage of mixing (until the cumulative number of ball mill revolutions reached 209,520) and was a sealed argon (Ar) atmosphere thereafter. The mixing was performed in the sealed gas mixture (Ar—$O_2$) atmosphere only in the initial stage of mixing (until the cumulative number of ball mill revolutions reached 209,520). This cumulative number of ball mill revolutions is only 7.4% of the final cumulative number of ball mill revolutions, i.e., 2,816,640, so that the amount of oxygen adsorbed on the surface of the C powder in the initial stage of mixing (until the cumulative number of ball mill revolutions reached 209,520) is considered to be small. Therefore, Comparative Example 1 is thought to be an experimental example in which the FePt powder and the C particles having a certain amount or less of oxygen adsorbed thereon are mixed 2,816,640−209,520=2,607,120 times in the argon (Ar) atmosphere.

30.00 g of the powder mixture mixed until the cumulative number of ball mill revolutions reached 1,405,080 was subjected to hot pressing under the conditions of temperature: 1,100° C., pressure: 25 MPa, time: 45 min., atmosphere: a vacuum of $5\times10^{-2}$ Pa or lower to thereby produce a disc-like sintered product having a diameter of 30 mm The density of each of the produced sintered products was measured by the Archimedes method, and the measured value was divided by a theoretical density to determine the relative density. The results are shown in TABLE 26 below. In Comparative Example 1, the theoretical density was not computed in consideration of a reduction in the amount of carbon during sintering, as was in Reference Examples 5 to 9 and Example 2.

TABLE 26

| Sintered powder mixture | Sintering temperature (° C.) | Density (g/cm³) | Theoretical density (g/cm³) | Relative density (%) |
|---|---|---|---|---|
| Powder mixture when cumulative number of ball mill revolutions was 1,810,080 | 1,100 | 8.16 | 11.47 | 71.1 |

The relative density of the sintered product was low, i.e., 71.1%, so that the sintered product contained a large amount of voids. If the relative density is computed using the theoretical density computed in consideration of a reduction in the amount of carbon during sintering, the relative density in Comparative Example 1 may be much smaller than 71.1%.

(Discussion)

The principal experimental data in Reference Examples 1 to 9 and Examples 1 to 2, and Comparative Example 1 is summarized in TABLE 27 below. In TABLE 27, the average size of the phase means the average size of the metal oxide phase in Reference Examples 1 to 4 and Example 1, or means the average size of the phase consisting of the C phase and the metal oxide phase in Reference Examples 5 to 9 and Example 2.

TABLE 27

|  | Composition of target | Atmosphere during mixing | Cumulative number of ball mill revolutions (Number) | Sintering temperature (° C.) | Relative density (%) | Average size of phase (μm) | Ignition |
|---|---|---|---|---|---|---|---|
| Reference example 1 | (50Fe—50Pt)—30 vol % $SiO_2$ | Ar + $O_2$ | 3,741,120 | 1050 | 98.61 | 0.34 | NO |
| Reference example 2 | (50Fe—50Pt)—30 vol % $TiO_2$ | Ar + $O_2$ | 3,741,120 | 950 | 96.69 | 0.28 | NO |
| Reference example 3 | (50Fe—50Pt)—36.63 vol % $B_2O_3$ | Ar + $O_2$ | 5,736,960 | 840 | 105.22 | 0.22 | NO |
| Reference example 4 | (50Fe—50Pt)—12.07 vol % $B_2O_3$—24.68 vol % $SiO_2$ | Ar + $O_2$ | 3,852,360 | 830 | 100.38 | 0.27 | NO |
| Reference example 5 | (50Fe—50Pt)—6 vol % C—24 vol % $SiO_2$ | Ar + $O_2$ | 3,741,120 | 1270 | 97.31 | 0.28 | NO |
| Reference example 6 | (50Fe—50Pt)—9 vol % C—21 vol % $SiO_2$ | Ar + $O_2$ | 3,741,120 | 1280 | 97.50 | 0.23 | NO |
| Reference example 7 | (50Fe—50Pt)—12 vol % C—18 vol % $SiO_2$ | Ar + $O_2$ | 3,741,120 | 1300 | 96.68 | 0.3 | NO |
| Reference example 8 | (50Fe—50Pt)—15 vol % C—15 vol % $SiO_2$ | Ar + $O_2$ | 3,741,120 | 1290 | 95.81 | 0.2 | NO |
| Reference example 9 | (50Fe—50Pt)—15 vol % C—15 vol % $TiO_2$ | Ar + $O_2$ | 3,741,120 | 1280 | 95.00 | 0.29 | NO |
| example 1 | (50Fe—45Pt—5Cu)—20.3 vol % $B_2O_3$ | Ar + $O_2$ | 3,852,360 | 770 | 100.09 | 0.14 | NO |
| example 2 | (45Fe—45Pt—10Cu)—15 vol % C—15 vol % $SiO_2$ | Ar + $O_2$ | 5,736,960 | 1420 | 93.36 | 0.27 | NO |
| Comparative example 1 | (50Fe—50Pt)—30 vol % C | Ar | 1,405,080 | 1100 | 71.10 | — | NO |
|  |  |  | 2,816,640 | — | — | — | Yes |

In Reference Examples 1 to 9 and Examples 1 to 2, no ignition was found even after the cumulative number of ball mill revolutions reached 3,000,000.

In Reference Examples 1 to 9 and Examples 1 to 2, Fe is alloyed with Pt to form FePt alloy powder; in Reference Examples 5 and 6, Fe is alloyed with Pt and Cu to form FePtCu alloy powder. This can reduce the activity of Fe even in the form of powder, thereby suppressing oxidation and ignition of Fe during mixing with the metal oxide powder or during mixing with the metal oxide powder and the C powder.

In Reference Examples 5 to 9 and Example 2, the powder mixture contains C powder. Since the atmosphere during the production of the powder mixture is a gas mixture (Ar+$O_2$), i.e., the atmosphere contains oxygen, a certain amount of oxygen is adsorbed to the surface of the C powder during mixing. Therefore, a certain amount of oxygen has already been adsorbed to the surface of C particles, and accordingly rapid adsorption of oxygen to the surface of the C particles and subsequent ignition of the C particles hardly occur even when the mixing container is opened to introduce the air after mixing, thereby allowing stable production even of the FePt-based sputtering target containing not only the metal oxide but also C.

However, in Reference Example 1 in which the FePt powder and the C powder were mixed in an argon atmosphere containing no oxygen during a period from when the cumulative number of ball mill revolutions was 209,521 to when it reached 2,816,640, ignition was found when the mixing container was opened at the point of time when the cumulative number of ball mill revolutions was 2,816,640. In Reference Example 1, this may be caused by mixing of the FePt powder and the C powder in an argon atmosphere containing no oxygen during a period from when the cumulative number of ball mill revolutions was 209,521 to when it reached 2,816,640, and by the content of the C powder as large as 30 vol %.

In Reference Examples 1 to 9 and Examples 1 to 2, the cumulative number of ball mill revolutions was 3,000,000 or more, i.e., in Reference Examples 1 to 9 and Examples 1 to 2, the powder mixtures were produced by sufficient mixing. Therefore, in Reference Examples 1 to 9 and Examples 1 to 2, the metal oxide powder and the C powder in the powder mixtures became small enough. Accordingly, this may allow, in the sintered products produced in Reference Examples 1 to 9 and Examples 1 to 2, the size of the metal oxide phase, or the average size of the phase consisting of the C phase and the $SiO_2$ phase, as measured by the intercept method, to be as small as 0.14 to 0.34 μm. Also this may allow the obtained sintered products to have a relative density as large as 90% or more.

In Comparative Example 1, the sintered product was produced using the powder mixture mixed until the cumulative number of ball mill revolutions reached 1,405,080, but the relative density of the produced sintered product was as small as 71.1%. One reason for this may be the influence of low sintering temperature, 1,100° C., in Reference Example 1. Another reason may be that, since the cumulative number of ball mill revolutions was small, the particle diameter of the C powder in the powder mixture used to produce the sintered product was not sufficiently reduced, so that voids in the sintered product became large and the relative density of the sintered product became small.

INDUSTRIAL APPLICABILITY

The target according to the present invention can be preferably used as an FePt-based sputtering target. The production process according to the present invention can be preferably used as a process for producing an FePt-based sputtering target.

REFERENCE SIGNS LIST

10 Substrate
10A Substrate surface
12 FePt alloy particles
14 Carbon phase

The invention claimed is:

1. A process for producing an FePt-based sputtering target, comprising:
adding metal oxide powder containing unavoidable impurities to FePt-based alloy powder containing Pt in an amount of 40 at % or more and less than 60 at % and one or more kinds of metal elements other than Fe and Pt in an amount of more than 0 at % and 20 at % or less with the balance being Fe and unavoidable impurities and with a total amount of Pt and the one or more kinds of metal elements being 60 at % or less so that the metal oxide powder accounts for 20 vol % or more and 40 vol % or less of a total amount of the FePt-based alloy powder and the metal oxide powder, followed by mixing the FePt-based alloy powder and the metal oxide powder to produce a powder mixture; and
molding the produced powder mixture while the powder mixture is heated under pressure.

2. A process for producing an FePt-based sputtering target, comprising:
adding C powder containing unavoidable impurities and metal oxide powder containing unavoidable impurities to FePt-based alloy powder containing Pt in an amount of 40 at % or more and less than 60 at % and one or more kinds of metal elements other than Fe and Pt in an amount of more than 0 at % and 20 at % or less with the balance being Fe and unavoidable impurities and with a total amount of Pt and the one or more kinds of metal elements being 60 at % or less so that the C powder and the metal oxide powder are added to satisfy:

$0 < \alpha \leq 20;$ $10 \leq \beta < 40;$ and $20 \leq \alpha + \beta \leq 40,$ where $\alpha$ and $\beta$ represent contents of the C powder and the metal oxide powder by vol %, respectively, based on a total amount of the FePt-based alloy powder, the C powder, and the metal oxide powder, followed by mixing the FePt-based alloy powder, the C powder, and the metal oxide powder to produce a powder mixture; and
molding the produced powder mixture while the powder mixture is heated under pressure.

3. The process for producing an FePt-based sputtering target according to claim 1,
wherein a metal oxide phase in the obtained FePt-based sputtering target has an average phase size of 0.4 μm or less as determined by an intercept method.

4. The process for producing an FePt-based sputtering target according to claim 2,
wherein a phase consisting of the C phase and the metal oxide phase in the obtained FePt-based sputtering target has an average size of 0.4 μm or less as determined by an intercept method.

5. The process for producing an FePt-based sputtering target according to claim 1,
wherein the one or more kinds of metal elements other than Fe and Pt are one or more kinds of Cu, Ag, Mn, Ni, Co, Pd, Cr, V, and B.

6. The process for producing an FePt-based sputtering target according to claim 2,
wherein the one or more kinds of metal elements other than Fe and Pt are one or more kinds of Cu, Ag, Mn, Ni, Co, Pd, Cr, V, and B.

7. The process for producing an FePt-based sputtering target according to claim 1,
wherein the one or more kinds of metal elements other than Fe and Pt include Cu.

8. The process for producing an FePt-based sputtering target according to claim 2,
wherein the one or more kinds of metal elements other than Fe and Pt include Cu.

9. The process for producing an FePt-based sputtering target according to claim 1,
wherein the one or more kinds of metal elements other than Fe and Pt are only Cu.

10. The process for producing an FePt-based sputtering target according to claim 2,
wherein the one or more kinds of metal elements other than Fe and Pt are only Cu.

11. The process for producing an FePt-based sputtering target according to claim 1,
wherein the metal oxide contains at least one of $SiO_2$, $TiO_2$, $Ti_2O_3$, $Ta_2O_5$, $Cr_2O_3$, $CoO$, $Co_3O_4$, $B_2O_3$, $Fe_2O_3$, $CuO$, $Cu_2O$, $Y_2O_3$, $MgO$, $Al_2O_3$, $ZrO_2$, $Nb_2O_5$, $MoO_3$, $CeO_2$, $Sm_2O_3$, $Gd_2O_3$, $WO_2$, $WO_3$, $HfO_2$, and $NiO_2$.

12. The process for producing an FePt-based sputtering target according to claim 2,
wherein the metal oxide contains at least one of $SiO_2$, $TiO_2$, $Ti_2O_3$, $Ta_2O_5$, $Cr_2O_3$, $CoO$, $Co_3O_4$, $B_2O_3$, $Fe_2O_3$, $CuO$, $Cu_2O$, $Y_2O_3$, $MgO$, $Al_2O_3$, $ZrO_2$, $Nb_2O_5$, $MoO_3$, $CeO_2$, $Sm_2O_3$, $Gd_2O_3$, $WO_2$, $WO_3$, $HfO_2$, and $NiO_2$.

13. The process for producing an FePt-based sputtering target according to claim 1,
wherein the mixing to produce the powder mixture is performed in an atmosphere in the presence of oxygen.

14. The process for producing an FePt-based sputtering target according to claim 2,
wherein the mixing to produce the powder mixture is performed in an atmosphere in the presence of oxygen.

15. The process for producing an FePt-based sputtering target according to claim 13,
wherein oxygen is supplied to the atmosphere from outside of the atmosphere.

16. The process for producing an FePt-based sputtering target according to claim 14,
wherein oxygen is supplied to the atmosphere from outside of the atmosphere.

17. The process for producing an FePt-based sputtering target according to claim 15,
wherein the oxygen is supplied by supplying air.

18. The process for producing an FePt-based sputtering target according to claim 16,
wherein the oxygen is supplied by supplying air.

19. The process for producing an FePt-based sputtering target according to claim 13,
wherein the atmosphere is air.

20. The process for producing an FePt-based sputtering target according to claim 14,
wherein the atmosphere is air.

21. The process for producing an FePt-based sputtering target according to claim 13,
wherein the atmosphere is composed substantially of an inert gas and oxygen.

22. The process for producing an FePt-based sputtering target according to claim 14,
wherein the atmosphere is composed substantially of an inert gas and oxygen.

23. The process for producing an FePt-based sputtering target according to claim 13,
wherein a concentration of oxygen in the atmosphere is 10 vol % or higher and 30 vol % or lower.

24. The process for producing an FePt-based sputtering target according to claim 14,
   wherein a concentration of oxygen in the atmosphere is 10 vol % or higher and 30 vol % or lower.

25. The process for producing an FePt-based sputtering target according to claim 13,
   wherein the atmosphere is released to air during the mixing.

26. The process for producing an FePt-based sputtering target according to claim 14,
   wherein the atmosphere is released to air during the mixing.

* * * * *